United States Patent
Yamauchi et al.

(10) Patent No.: US 6,931,482 B2
(45) Date of Patent: Aug. 16, 2005

(54) SEMICONDUCTOR MEMORY DEVICE INTERNALLY PROVIDED WITH LOGIC CIRCUIT WHICH CAN BE READILY CONTROLLED AND CONTROLLING METHOD THEREOF

(75) Inventors: Tadaaki Yamauchi, Hyogo (JP); Kunihiko Kozaru, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 676 days.

(21) Appl. No.: 09/823,996

(22) Filed: Apr. 3, 2001

(65) Prior Publication Data

US 2002/0040437 A1 Apr. 4, 2002

(30) Foreign Application Priority Data

Sep. 29, 2000 (JP) ........................................ 2000-299012

(51) Int. Cl.⁷ .............................................. G06F 13/00
(52) U.S. Cl. ...................... 711/104; 711/105; 713/168; 380/30; 365/189.01; 365/189.08; 365/230.01; 365/230.08
(58) Field of Search ................................. 711/104, 105; 365/189.01, 189.08, 230.01, 230.06, 230.08, 190; 713/168; 380/30

(56) References Cited

U.S. PATENT DOCUMENTS

| | | | |
|---|---|---|---|
| 4,835,733 A | 5/1989 | Powell | |
| 5,862,396 A | 1/1999 | Motomura | |
| 5,953,738 A | 9/1999 | Rao | |
| 6,122,214 A * | 9/2000 | Fujimoto et al. | 365/222 |
| 6,130,852 A * | 10/2000 | Ohtani et al. | 365/230.03 |
| 6,134,174 A * | 10/2000 | Takase | 365/230.06 |
| 6,262,930 B1 * | 7/2001 | Mori et al. | 365/226 |
| 6,317,368 B1 * | 11/2001 | Taito et al. | 365/189.11 |
| 6,338,108 B1 * | 1/2002 | Motomura | 710/110 |
| 6,367,044 B1 * | 4/2002 | Komoike | 714/739 |
| 6,370,080 B2 * | 4/2002 | Takase | 365/230.06 |
| 6,535,412 B1 * | 3/2003 | Maruyama et al. | 365/63 |

FOREIGN PATENT DOCUMENTS

| | | |
|---|---|---|
| JP | 11-126476 | 5/1999 |
| JP | 11-339465 | 12/1999 |

OTHER PUBLICATIONS

"Modern Cipher Theory", by Ikeno et al., The Institute of Electronics, Information and Communication Engineers, pp. 1–5, 48–49, 104–109.

* cited by examiner

Primary Examiner—Mano Padmanabhan
Assistant Examiner—Jasmine Song
(74) Attorney, Agent, or Firm—McDermott Will & Emery LLP

(57) ABSTRACT

If a region designated by an address signal is a logic control region, an interface portion transmits/receives data to/from a register instead of a DRAM. A data signal used at that time is a control command for a logic circuit held in the register or input data for a process in the logic circuit. Depending on the content held in the register, the logic circuit performs, for example, an encryption process or a process which takes for a microcomputer a long time to complete such as an image processing. The result of processing is stored in the register and read in a sequence of reading from the DRAM.

13 Claims, 35 Drawing Sheets

FIG.9

| PUBLIC KEY CRYPTOSYSTEM | SECRET KEY CRYPTOSYSTEM | |
|---|---|---|
| RSA | DES Triple DES | BLOCK ENCRYPTION MODE |
| | | ECB:Electric Code Book<br>CBC:Cipher Block Chaining<br>OFB:Output Feed Back<br>CFB:Cipher Feed Back |

SUPPORTED CRYPTOSYSTEMS

FIG.10

- BOTH FOR PUBLIC KEY AND SECRET KEY METHODS

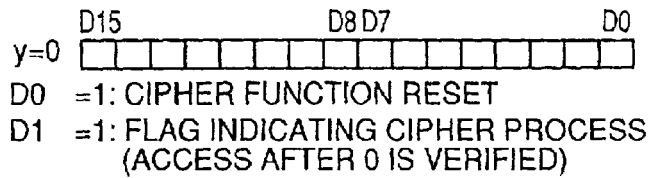

D0 =1: CIPHER FUNCTION RESET
D1 =1: FLAG INDICATING CIPHER PROCESS
(ACCESS AFTER 0 IS VERIFIED)

FIG.11

- CONTROL IN SECRET KEY METHOD

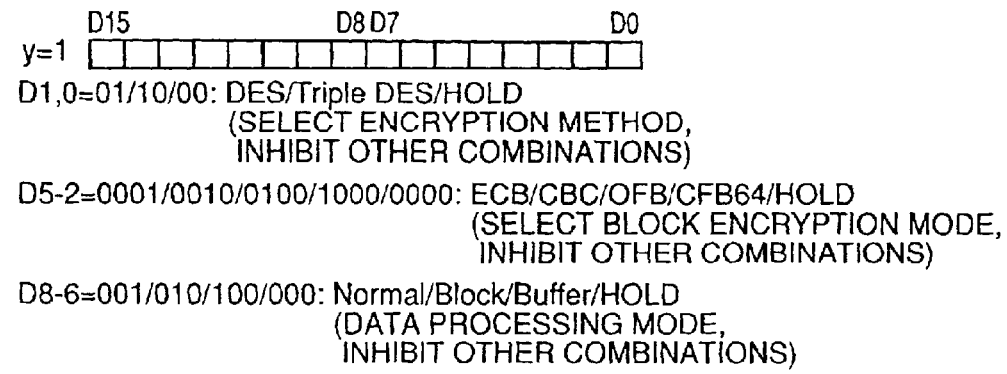

D1,0=01/10/00: DES/Triple DES/HOLD
(SELECT ENCRYPTION METHOD,
INHIBIT OTHER COMBINATIONS)

D5-2=0001/0010/0100/1000/0000: ECB/CBC/OFB/CFB64/HOLD
(SELECT BLOCK ENCRYPTION MODE,
INHIBIT OTHER COMBINATIONS)

D8-6=001/010/100/000: Normal/Block/Buffer/HOLD
(DATA PROCESSING MODE,
INHIBIT OTHER COMBINATIONS)

FIG.12

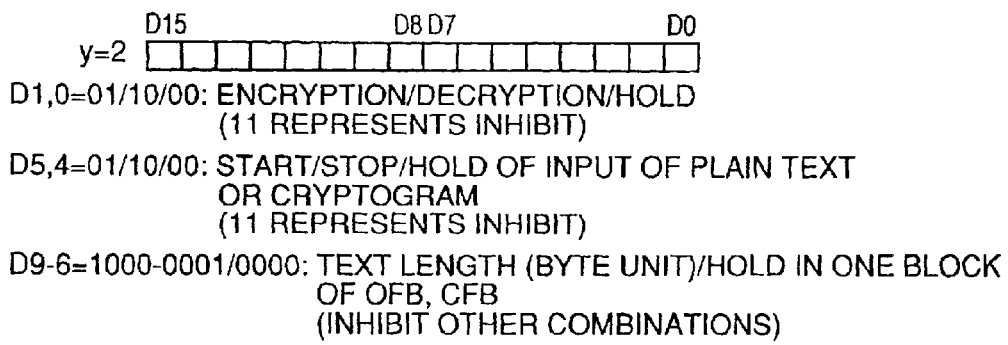

D1,0=01/10/00: ENCRYPTION/DECRYPTION/HOLD
(11 REPRESENTS INHIBIT)

D5,4=01/10/00: START/STOP/HOLD OF INPUT OF PLAIN TEXT
OR CRYPTOGRAM
(11 REPRESENTS INHIBIT)

D9-6=1000-0001/0000: TEXT LENGTH (BYTE UNIT)/HOLD IN ONE BLOCK
OF OFB, CFB
(INHIBIT OTHER COMBINATIONS)

FIG.13

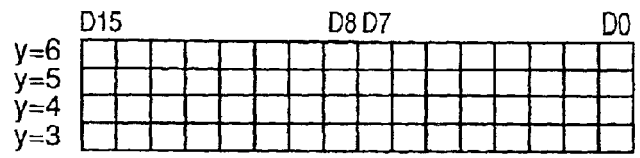

KEY 1 (MAXIMUM LENGTH OF 64 BITS): KEY OF DES,
KEY WITH RESPECT TO E OF EDE OF TRIPLE DES

KEY 2 (MAXIMUM LENGTH OF 64 BITS):
KEY WITH RESPECT TO D OF EDE OF TRIPLE DES

IV: INITIAL VECTOR

BLOCK LENGTH: SET BY BYTE UNIT
Max=2kByte(D=#FF) Min=1Byte(D=#0)

BUFFER NUMBER: VALID IN BUFFER MODE
Max=64k(D=#FFFF) Min=1(D=#0)

BUFFER ID:

FIG.30

| BA0 | BA1 | A11 | A10 | A9 | A8 | A7 | A6 | A5 | A4 | A3 | A2 | A1 | A0 |
|-----|-----|-----|-----|----|----|----|----|----|----|----|----|----|----|
|     |     |     |     |    | 0  | 0  |    |    |    |    |    |    |    |

FIG.31

| Bits | Name | Description | |
|------|------|-------------|---|
| A2..0 | Burst Length | 000<br>001<br>010<br>011<br><br>100<br>101<br>110<br>111 | 1<br>2<br>4<br>8<br><br>R<br>R<br>R<br>Full Page |
| A3 | Burst Type | 0<br><br>1 | Sequential<br><br>Interleaved |
| A6..4 | CAS Latency | 000<br>001<br>010<br>011<br>1XX | R<br>R<br>2<br>3<br>R |
| A9 | Write Mode | 0<br>1 | Burst<br>Single Bit |
| A10 | Control Reg. Access | 0<br>1 | Disable<br>Enable |
| A11 | Control Reg. Address | 0<br>1 | X=3FFF<br>X=0 |
| BA1 | Low Power Mode | 0<br>1 | Disable<br>Enable |
| BA0 | Low Clock Frequency | 0<br>1 | Disable<br>Enable |

FIG.34

| Col. Add. | Bits | Name | Description | | Access |
|---|---|---|---|---|---|
| h00 | D0 | Software Reset | Reset | 1 | W |
| | D1 | Flag | Done | 0 | R |
| | | | Processing | 1 | R |
| | D2 | Change add for reg. cont. | X=h3FFF | 1 | W |
| | D3 | Change add for reg. cont. | X=h0 | 1 | W |
| | D4 | EOF(End of File) | | 1 | W |
| h01 | D1 | Partial Refresh | Bank0 Enable/Disable | 1/0 | W |
| | D2 | | Bank1 Enable/Disable | 1/0 | W |
| | D3 | | Bank2 Enable/Disable | 1/0 | W |
| | D4 | | Bank3 Enable/Disable | 1/0 | W |
| | D5 | LP Mode | Enable/Disable | 1/0 | W |
| | D6 | Low Clock Frequency | Enable/Disable | 1/0 | W |

FIG.35

| Col. Add. | Bits | Name | | Description | Access |
|---|---|---|---|---|---|
| h02 | D1..0 | Secret Cryp. Mode | 00 | Hold | W |
| | | | 01 | DES-56 | W |
| | | | 10 | Triple DES-112 | W |
| | | | 11 | Triple DES-168 | W |
| | D5..2 | Block Cryp. Mode | 0000 | Hold | W |
| | | | 0001 | ECB | W |
| | | | 0010 | CBC | W |
| | | | 0100 | OFB | W |
| | | | 1000 | CFB-64 | W |
| | D9..6 | Enabled bank set in Reg-DRAM transfer mode | 0000 | All Bank Disable | W |
| | D6 | | 1/0 | Bank0 Enable/Disable | W |
| | D7 | | 1/0 | Bank1 Enable/Disable | W |
| | D8 | | 1/0 | Bank2 Enable/Disable | W |
| | D9 | | 1/0 | Bank3 Enable/Disable | W |
| | D10 | Simulatenous transfer | 1/0 | Enable/Disable | W |

FIG.36

| Col. Add. | Bits | Name | | Description | Access |
|---|---|---|---|---|---|
| h03 | D1..0 | ENC/DEC | 00 | Hold | W |
| | | | 01 | Encryption | W |
| | | | 10 | Decryption | W |
| | | | 11 | RFU | W |
| | D2 | Counter of reg1 | 1 | Reset | W |
| | D3 | Counter of reg2 | 1 | Reset | W |
| | D4 | IV Load | 0 | Previous output | W |
| | | | 1 | IV Load | W |
| | D8..5 | Text length per block | 0000 | Hold | W |
| | | | Else | (D8..5)x1Byte | W |
| h04 | D15..0 | Reg.1 Access | - | Write Data: D15..0 | W |
| h05 | D15..0 | Reg.2 Access | - | Read Data: D15..0 | R |
| h06 | D0 | Reg-DRAM transfer | 1 | Mode entry | W |
| | D1 | | 1 | Mode exit | W |
| | D2 | | 1 | Counter reset of reg1 | W |
| | D3 | | 1 | Counter reset of reg1 | W |

FIG.37

| Col. Add. | Bits | Name | | Description | Access |
|---|---|---|---|---|---|
| h13-h10 | D15..0 | Key1 for DES, Triple DES | LSB: h10[D0]<br>USB: h13[D15] | Key1 Input | W |
| h17-h14 | D15..0 | Key2 for Triple DES | LSB: h14[D0]<br>USB: h17[D15] | Key2 Input | W |
| h1B-h18 | D15..0 | Key3 for Triple DES-168 | LSB: h18[D0]<br>USB: h17B[D15] | Key3 Input | W |
| h1F-h1C | D15..0 | Initial Vector (IV) | LSB: h1C[D0]<br>USB: h1F[D15] | IV Input | W |
| hFF-h20 | D15..0 | Reserved | | | |

CONTROL CRYP TERMINAL BY I/O PORT

FIX CRYP TERMINAL AT L

FIX CRYP TERMINAL AT H

⟨BASIC UNIT FOR ENCRYPTION PROCESS⟩

DES-56

Triple DES-112

Triple DES-168

⟨BASIC UNIT FOR DECRYPTION PROCESS⟩

DES-56

Triple DES-112

Triple DES-168

FIG.48
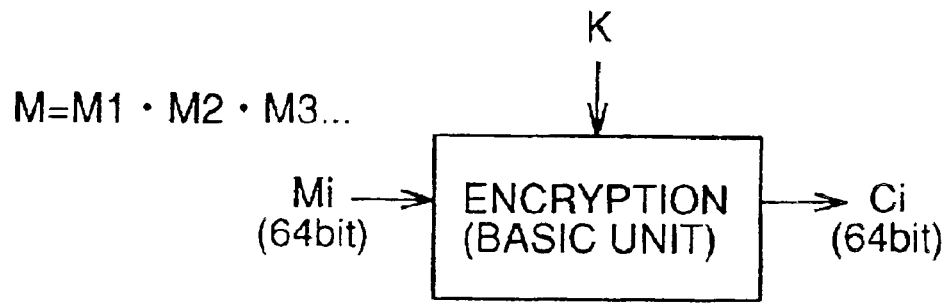
FIG.49
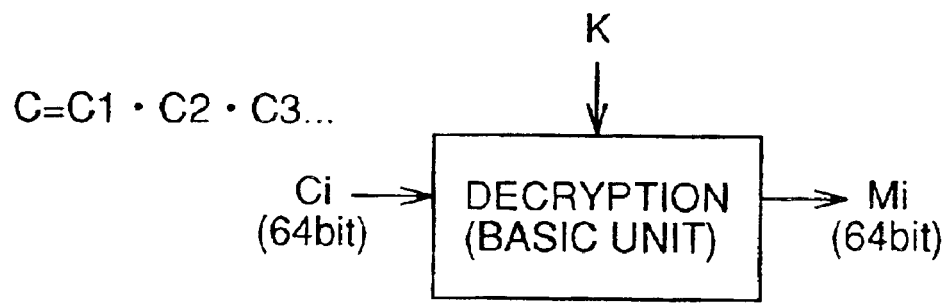
FIG.50
$C1 = Ek\ (M1 \oplus IV)$
$Ci = Ek\ (Mi \oplus Ci\text{-}1)$ \ \ \ \ $(i=2,3,......)$
$M1 = Dk\ (C1) \oplus M1$
$Mi = Dk\ (Ci) \oplus Ci\text{-}1$ \ \ \ \ $(i=2,3,......)$ MAKE INITIAL VALUE CORRESPOND TO CRYPTOGRAM Ci IMMEDIATELY BEFORE IF PLAIN TEXT M IS LONGER THAN REGISTER 1

⟨SCHEMATIC DIAGRAM OF ENCRYPTION IN CBC MODE⟩

MAKE INITIAL VALUE CORRESPOND TO ENCYRPTION TEXT Ci IMMEDIATELY BEFORE IF PLAIN TEXT M IS LONGER THAN REGISTER 1

⟨SCHEMATIC DIAGRAM OF DECRYPTION IN CBC MODE⟩

FIG.53 PRIOR ART

| Left | | | Right |
|---|---|---|---|
| $V_{DD}$ | 1 | 54 | $V_{SS}$ |
| $DQ_0$ | 2 | 53 | $DQ_{15}$ |
| $V_{DDQ}$ | 3 | 52 | $V_{SSQ}$ |
| $DQ_1$ | 4 | 51 | $DQ_{14}$ |
| $DQ_2$ | 5 | 50 | $DQ_{13}$ |
| $V_{SSQ}$ | 6 | 49 | $V_{DDQ}$ |
| $DQ_3$ | 7 | 48 | $DQ_{12}$ |
| $DQ_4$ | 8 | 47 | $DQ_{11}$ |
| $V_{DDQ}$ | 9 | 46 | $V_{SSQ}$ |
| $DQ_5$ | 10 | 45 | $DQ_{10}$ |
| $DQ_6$ | 11 | 44 | $DQ_9$ |
| $V_{SSQ}$ | 12 | 43 | $V_{DDQ}$ |
| $DQ_7$ | 13 | 42 | $DQ_8$ |
| $V_{DD}$ | 14 | 41 | $V_{SS}$ |
| DQML | 15 | 40 | NC |
| /WE | 16 | 39 | DQMU |
| /CAS | 17 | 38 | CLK |
| /RAS | 18 | 37 | CKE |
| /CS | 19 | 36 | NC |
| $BA_0(A_{13})$ | 20 | 35 | $A_{11}$ |
| $BA_1(A_{12})$ | 21 | 34 | $A_9$ |
| $A_{10}$ | 22 | 33 | $A_8$ |
| $A_0$ | 23 | 32 | $A_7$ |
| $A_1$ | 24 | 31 | $A_6$ |
| $A_2$ | 25 | 30 | $A_5$ |
| $A_3$ | 26 | 29 | $A_4$ |
| $V_{DD}$ | 27 | 28 | $V_{SS}$ |

| TERMINAL NAME | FUNCTION |
|---|---|
| CLK | MASTER CLOCK |
| CKE | CLOCK ENABLE |
| /CS | CHIP SELECT |
| /RAS | ROW ADDRESS STROBE |
| /CAS | COLUMN ADDRESS STROBE |
| /WE | WRITE ENABLE |
| $DQ_{0\sim15}$ | DATA INPUT/OUTPUT |
| DQM(U/L) | OUTPUT DISABLE/WRITE MASK |
| $A_{0\sim11}$ | ADDRESS INPUT |
| $BA_{0,1}(A_{12,13})$ | BANK ADDRESS |
| $V_{DD}$ | POWER SUPPLY POTENTIAL |
| $V_{DDQ}$ | POWER SUPPLY POTENTIAL FOR OUTPUT |
| $V_{SS}$ | GROUND |
| $V_{SSQ}$ | GROUND FOR OUTPUT |

SEMICONDUCTOR MEMORY DEVICE INTERNALLY PROVIDED WITH LOGIC CIRCUIT WHICH CAN BE READILY CONTROLLED AND CONTROLLING METHOD THEREOF

BACKGROUND OF THE INVENTION

1. Field of the Invention

The present invention relates to semiconductor memory devices and, more specifically, to a semiconductor memory device internally provided with a logic circuit and a controlling method thereof.

2. Description of the Background Art

FIG. 53 is a diagram showing a pin arrangement of a conventional synchronous dynamic random access memory (SDRAM) having a capacity of 64 Mbit and a bus width of 16 bits.

FIG. 54 is a table showing terminal names and functions of the SDRAM.

Referring to FIGS. 53 and 54, the conventional SDRAM is enclosed in a package having 54 pins as terminals. The conventional SDRAM includes: a terminal CLK receiving a master clock; a terminal CKE receiving a clock enable signal; a terminal /CS receiving a chip select signal; a terminal /RAS receiving a row address strobe signal; a terminal /CAS receiving a column address strobe signal; and a terminal /WE receiving a write enable signal.

The conventional SDRAM further includes: terminals DQO to DQ15 receiving and outputting a data input/output signal; a terminal DQM (U/L) inputting/outputting an output disable signal /write mask signal; terminals A0 to A11 receiving an address; terminals BA0, BA1 receiving a bank address; a terminal VDD supplied with a power supply potential; a terminal VDDQ supplied with a power supply potential for output; a terminal VSS supplied with a ground potential; and a terminal VSSQ supplied with a ground potential for output.

As shown in FIG. 53, the pins for data input/output and power supply sources are arranged from as pins 1 to 13 and 42 to 54. The pins for control signals and clock signals are arranged as pins 15 to 19 and 37 to 39. Address input pins are arranged as pins 20 to 35. Such a terminal arrangement has generality to some extent, and is commonly used for a circuit board in a system provided with a memory.

FIG. 55 is a diagram showing a structure of a conventional DRAM provided with a logic.

Referring to FIG. 55, a chip 501 has a DRAM 504 and a logic 508, and is also provided with terminals for inputting or outputting control signals /RAS, /CAS, . . . , /CS, an address signal ADD, and a data signal DATA for accessing the DRAM.

Chip 501 further includes terminals for inputting control pins CTR0, CTR1 specific to a logic and a request signal REQ requesting the logic for access, and a terminal for outputting a strobe signal STRB used by the logic to notify an external portion of completion of a process.

Conventionally, for controlling logic 508, a special pin has been arranged. Thus, a greater number of pins are required for a general purpose DRAM as shown in FIG. 53, or a controller for controlling the DRAM with a logic must be prepared to form a system on a board. As a result, generality for connection to a general microcomputer is impaired, or a special command for the microcomputer must be used to control the system.

SUMMARY OF THE INVENTION

An object of the present invention is to provide a semiconductor memory device provided with a logic circuit capable of controlling a logic portion by a method similar to that used by a general purpose DRAM.

In short, the present invention is a semiconductor memory device provided with a terminal group, memory cell array, and logic circuit.

The terminal group receives an externally applied control signal, address, and data. The memory cell array transmits/receives data to/from a region designated by the address in accordance with the control signal. If the control signal, address, and data are applied to the terminal group in a sequence of applying the control signal, address, and data to the memory cell array, when the address designates a prescribed first region, the logic circuit performs a data process in accordance with at least one of the control signal, address, and data.

According to another aspect of the present invention, a method of controlling a semiconductor memory device is provided which has a designating step and a step of applying a command.

The semiconductor memory device is provided with a terminal group, memory cell array, and logic circuit. The terminal group receives an externally applied control signal, address, and data. The memory cell array transmits/receives data to/from a region designated by the address in accordance with the control signal. If the control signal, address, and the data are applied to the terminal group in a sequence of applying the control signal, address, and data to the memory cell array, when the address designates a prescribed first region, the logic circuit performs a data process in accordance with at least one of the control signal, address, and data.

In the designating step, the first region is designated as a reserved region. In the step of applying command, the first region is designated by the address in a sequence of writing to the memory cell array and a command is applied to the logic circuit.

According to still another aspect of the present invention, a semiconductor memory device is provided which includes a first terminal group, second terminal, memory, and logic circuit.

The first terminal group receives an externally applied control signal, address, and data. The second terminal receives an externally applied select signal. The memory includes a plurality of memory cells arranged in a matrix and is activated in accordance with the select signal for transmitting/receiving data to/from a region designated by the address in accordance with the control signal. The logic circuit is activated in a manner complementary to the memory in accordance with the select signal for performing a data process in accordance with at least one of the address and the data.

Therefore, a main advantage of the present invention is that the internally provided logic circuit can be controlled by applying a signal in a sequence of applying the data, address, and control signal to the general purpose memory, and control is facilitated without having to significantly change existing systems.

Another advantage of the present invention is that a semiconductor memory device internally provided with a logic can readily be controlled in a microcomputer system.

Still another advantage of the present invention is that control of an internally provided logic circuit can be performed by effectively using a path of applying an address and data to an internal memory with the minimum number of additional control terminals.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 9 is a diagram shown in conjunction with cryptosystems supported by a cipher operation logic 74 shown in FIG. 7.

FIGS. 10 to 18 are first to ninth diagrams each showing exemplary data allocated to a register.

FIGS. 29 to 31 are first to third diagrams shown in conjunction with a mode register 208 of FIG. 27.

FIGS. 34 to 37 are first to fourth diagrams each showing an address map of the control register.

FIGS. 48 and 49 are first and second diagrams shown in conjunction with an ECB mode.

FIG. 50 is a diagram shown in conjunction with an operation in a CBC mode.

FIG. 53 is a diagram showing a pin arrangement of a conventional synchronous dynamic random access memory (SDRAM).

DESCRIPTION OF THE PREFERRED EMBODIMENTS

Figure 1:
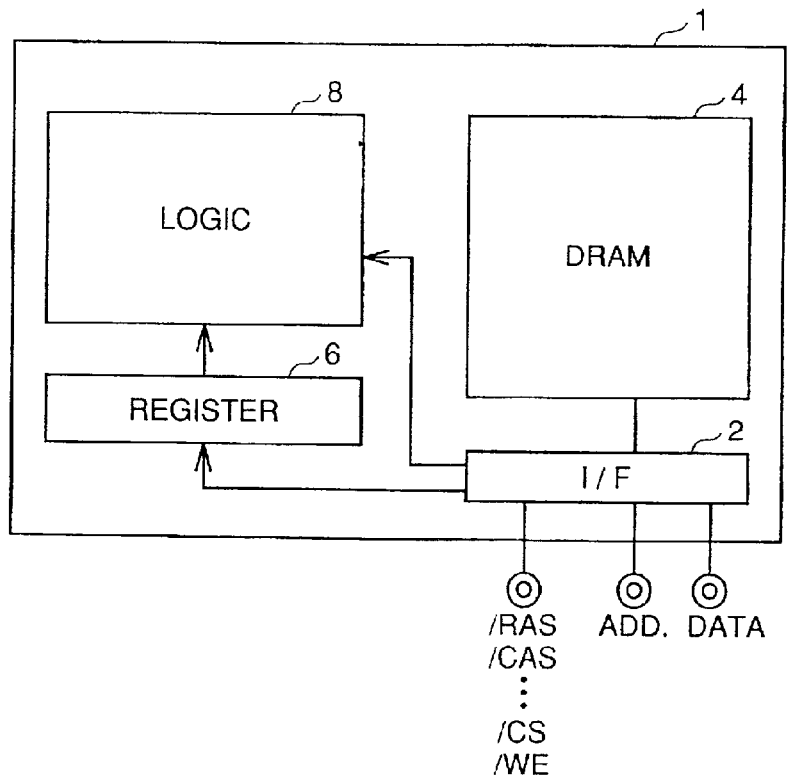
FIG. 1 is a block diagram showing a configuration of a semiconductor memory device 1 according to a first embodiment of the present invention.

Now, the embodiments of the present invention will be described in detail with reference to the drawings. It is noted that the same reference characters indicate the same or corresponding portions throughout the drawings.

First Embodiment

FIG. 1 is a block diagram showing a configuration of a semiconductor memory device 1 according to a first embodiment of the present invention.

Referring to FIG. 1, semiconductor memory device 1 includes: a terminal for receiving control signals such as /RAS, /CAS, . . . , /CS, /WE; a terminal for receiving an address signal ADD; a terminal for receiving a data signal DATA; an interface portion 2 outputting to an internal portion a control signal in accordance with control signals /RAS, /CAS, . . . , /CS, /WE, address signal ADD. and data signal DATA; a DRAM receiving an output from interface portion 2 for operation; a register 6 holding data or command applied from interface portion 2; and a logic circuit 8 performing an operation such as signal processing in accordance with outputs from register 6 and interface portion 2.

The terminals of semiconductor device 1 are only those used by a general purpose DRAM. Thus, the same package as that of a chip of the general purpose DRAM can be used. For example, a package having a pin arrangement as shown in FIG. 53 is used.

Accordingly, when semiconductor memory device 1 of the present invention is used with an existing application, there is no need to re-design a board or develop a special control LSI (Large Scale Integrated circuit), but the existing general purpose DRAM is only replaced. Namely, mere change of a software adds a new function since it is pin-compatible with the general purpose DRAM. Examples of new functions include a circuit for processing images at high speed or a logic circuit for performing such a process as encryption that cannot be rapidly performed by a microcomputer. Control signals may be input by using several unused terminals, e.g. NC (Non Connection) pins of a package enclosing the general purpose DRAM, such as pins 36 and 40 in FIG. 53.

Now, a controlling method will be described in detail. A so-called memory mapped I/O method is applied to control of the logic circuit.

Figure 2:
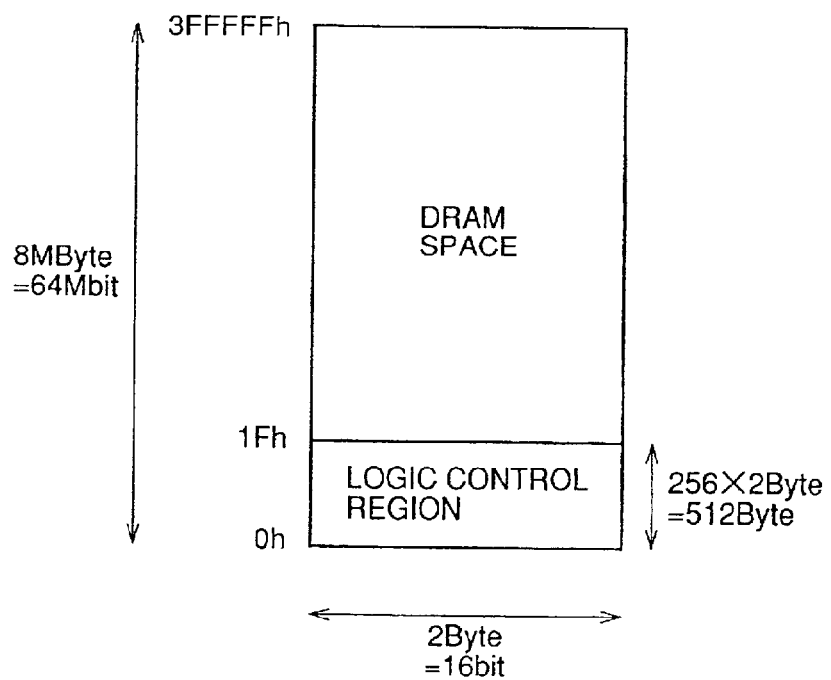
FIG. 2 is a diagram showing an exemplary memory map of the semiconductor memory device with a logic according to the first embodiment.

FIG. 2 is a diagram showing an exemplary memory map of the semiconductor memory device internally provided with a logic of the first embodiment.

Referring to FIG. 2, assume that a capacity of the DRAM on the chip is 64 Mbit, having a bus width of 16 bits. The DRAM has X addresses X0 to X13 and Y addresses Y0 to Y7. Thus, memory addresses that controls 8 Mbyte are 0h to 3FFFFFh.

The general purpose DRAM can write/read data to/from any portion of the address space. The space allowing writing and reading of data is referred to as a DRAM space. In the present invention, a specific region is designated as a logic control region for the logic circuit. For example, the space corresponding to addresses 0h to 1Fh is allocated as the logic control region. The capacity of the logic control region is for example 512 Byte of 256×2 Byte. A command or mode for controlling the logic can be selected in accordance with data written to the address space.

Although the region is allocated to the least significant side of addresses in FIG. 2, the logic control region to be allocated to the most significant side (3FFFFFh to 3FFFE0h). If an SDRAM is used in place of the DRAM, the region for the address may be selected when a mode register is set. If the logic control region is not allocated when the mode register is set, it can be used as a general SDRAM having 64 Mbit.

Figure 3:
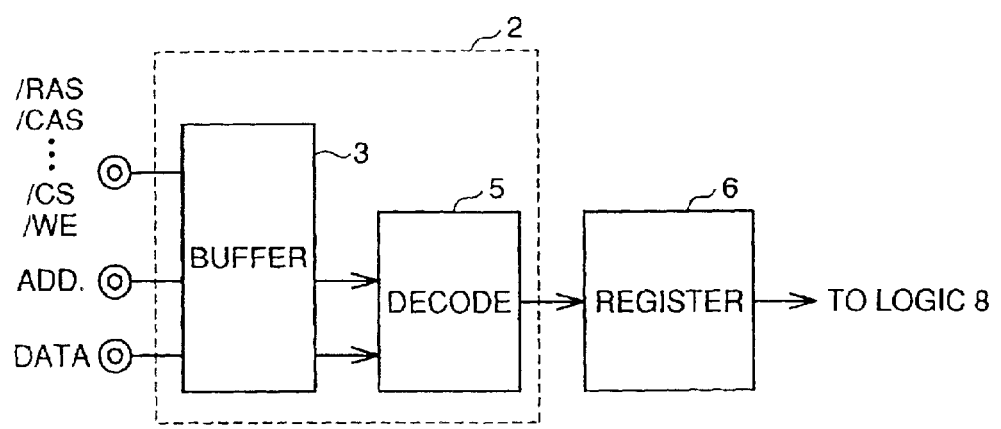
FIG. 3 is a diagram shown in conjunction with transmission of an externally input signal to a logic circuit.

FIG. 3 is a diagram shown in conjunction with transmission of an externally input signal to the logic circuit.

Referring to FIG. 3, interface portion 2 includes: a buffer 3 receiving control signals RAS, /CAS, . . . , /CS, /WE, an address signal ADD., and a data signal DATA; and a decode circuit 5 receiving and decoding an output from buffer 3. A register 6 holds information such as a mode or command in accordance with an output from decode circuit 5. Based on the held information, a logic circuit 8 is controlled.

Decode circuit 5 decodes address signal ADD and data signal DATA, but in some cases directly store data written to the logic control region designated by the address signal in register 6. When the register consists of an SRAM (Static Random Access Memory) or the like, data may be stored in the region of the SRAM designated by address signal ADD. A part of the region of the DRAM may be used as a holding circuit in place of register 6, in which region data for controlling the logic circuit would be held.

Figure 4:
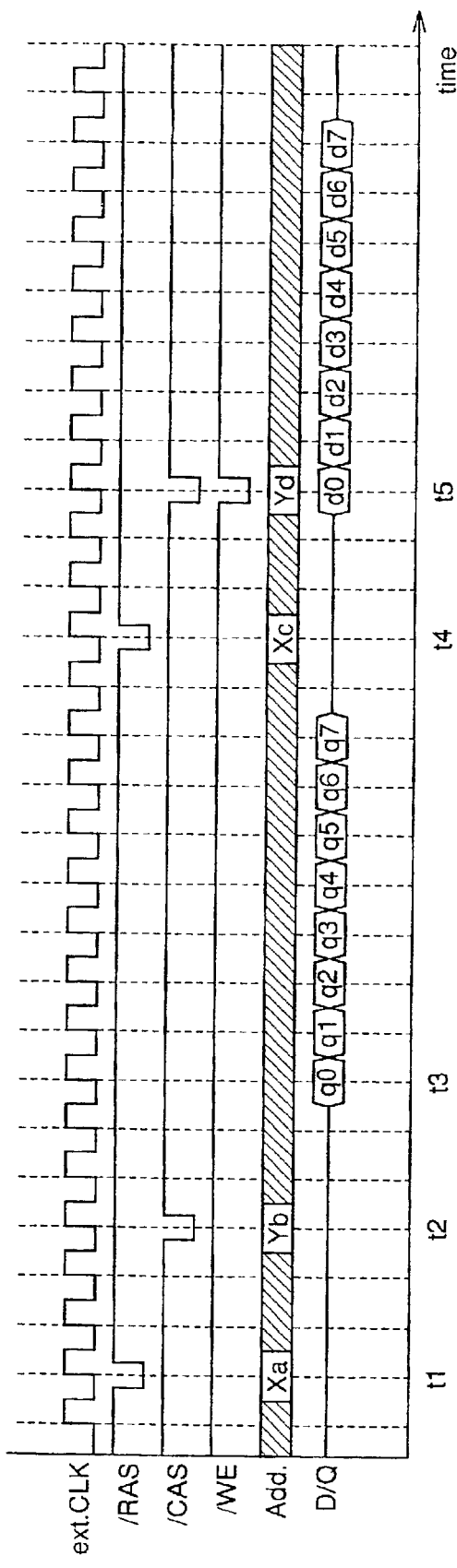
FIG. 4 is a waveform diagram shown in conjunction with a general timing of the semiconductor memory device of the first embodiment.

FIG. 4 is a diagram of waveforms shown in conjunction with a general timing of the semiconductor memory device of the first embodiment. FIG. 4 relates to an operation of successively writing or reading eight data in the SDRAM capable of inputting and outputting from a data input/output terminal. A bit number of data which are successively read is referred to as a burst length and, in the SDRAM, the bit number can be generally changed by the mode register.

Referring to FIG. 4, at a time t1, external control signals (row address strobe signal /RAS, column address strobe signal /CAS, address signal ADD and the like) are incorporated at a rising edge of an external clock signal ext.CLK (e.g., a system clock). Since row address strobe signal /RAS is at an L level in an active state and column address strobe signal /CAS and write enable signal /WE are at an H level, it means that a row active command ACT is input. Address signal ADD at that time is incorporated as a row address Xa.

At a time t2, column address strobe signal /CAS attains to the L level in the active state and is incorporated in synchronization with the rise of clock signal ext.CLK. A combination of column address strobe signal /CAS at the L level and row address strobe signal /RAS and write enable signal /WE both at the H level corresponds to a read command READ. Address signal ADD at that time is incorporated as a column address Y.

When the region designated by the address is the DRAM space in FIG. 2, a row and column selecting operation is performed in DRAM 4 of FIG. 1 in accordance with these incorporated row address Xa and column address Yb.

When row address Xa and column address Yb are in the logic control region of FIG. 2, a prescribed region of register 6 is selected rather than the row and column of DRAM 4 of FIG. 1. For example, in the prescribed region, a flag indicating an operation state of logic 8 or an operation result of logic 8 is stored.

D/Q indicates data signal DATA input/output through the data input/output terminal. The first data q0 is output at a time t3 when a prescribed clock period (6 clock cycles in FIG. 4) is elapsed after the fall of row address strobe signal /RAS to the L level and, data q1 to q7 are successively output following data q0. The data is output in response to the fall of clock signal ext.CLK.

The output data is data held in DRAM 4 or a content of register 6. The content of register 6 is for example a flag indicating the operation state of logic 8 or an operation result of logic 8.

After a time t4, a writing operation is performed. At t4, row active command ACT is input and row address Xc is incorporated. At a time t5, when a combination of column address strobe signal /CAS and write enable signal /WE both at the L level in the active state and row address strobe signal /RAS at the H level, i.e., a write command WRITE is applied, a column address Yd is accepted at the rising edge of clock signal ext.CLK and data d0, applied at that time, is accepted as initial write data.

If the region designated by the address is the DRAM space of FIG. 2, the row and column selecting operation is performed in the SDRAM in response to the fall of row address strobe signal /RAS and the column address strobe signal /CAS. Subsequently, input data d1 to d7 are sequentially incorporated in synchronization with clock signal ext.CLK and written to the corresponding memory cell.

When the region designated by row address Xc and the column address Yd is the logic control region of FIG. 2, a prescribed region of register 6, rather than the row and column of DRAM 4 of FIG. 1, is selected. In this case, input data d1 to d7 are data to be written to the prescribed region of register 6. For example, image data processed by logic 8, process data such as cipher data, and command data designating an operation such as reset or start of process are applied.

Modification of First Embodiment

Figure 5:
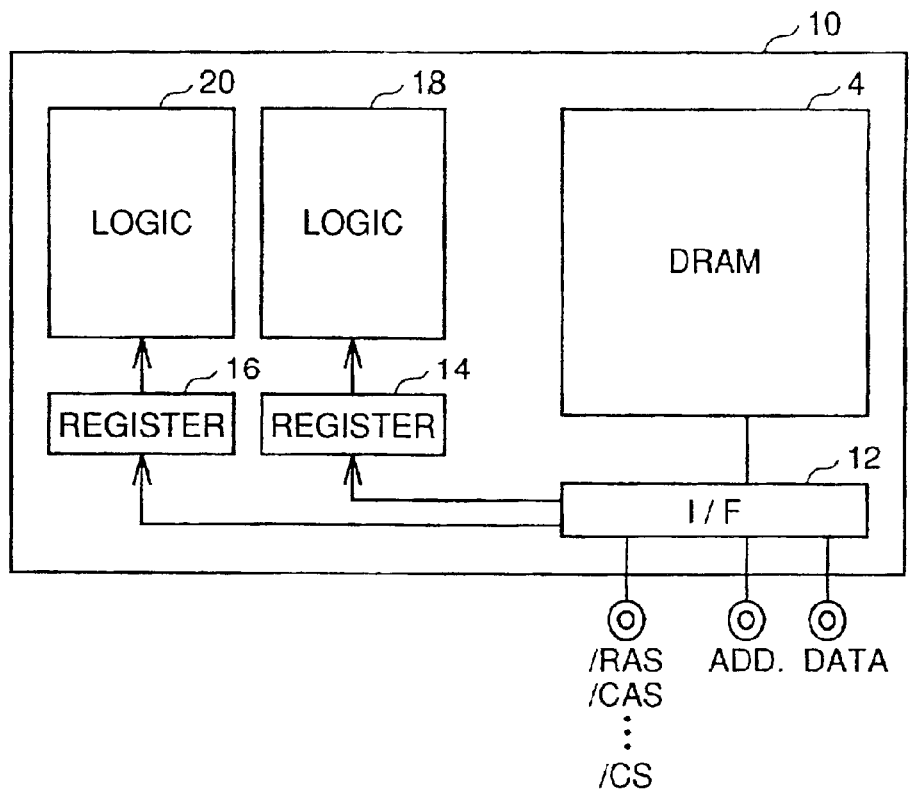
FIG. 5 is a block diagram showing a configuration of a DRAM 10 with a logic according to a modification of the first embodiment.

FIG. 5 is a block diagram showing a configuration of a DRAM 10 internally provided with a logic according to a modification of the first embodiment.

Referring to FIG. 5, DRAM 10 with logic includes: an interface portion 12 receiving control signals /RAS, /CAS, . . ., /CS, an address signal ADD, and data signal DATA; a DRAM 4 operating in accordance with an output from interface portion 12; registers 14, 16 holding data for control in accordance with an output from interface portion 12; and logic circuits 18 and 20 operating in accordance with the data for control respectively held in registers 14 and 16.

Figure 6:
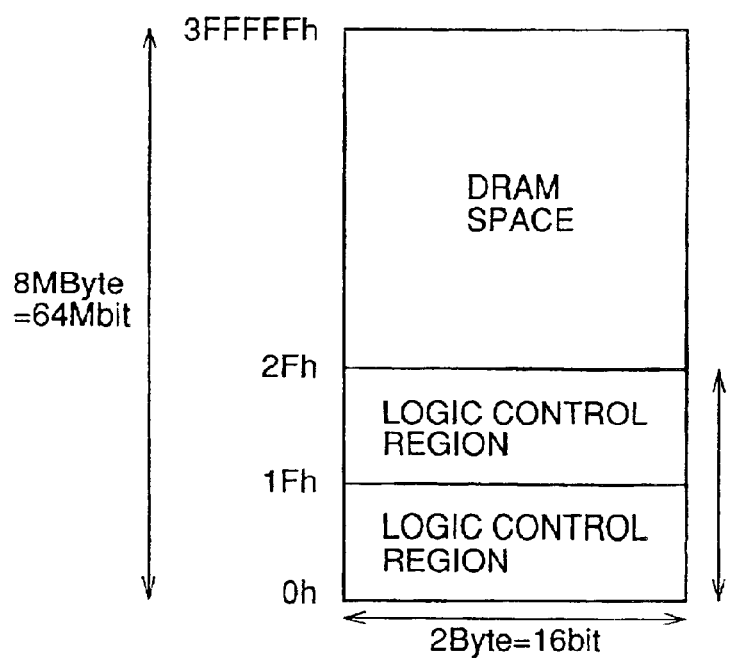
FIG. 6 is a diagram showing a memory map of DRAM 10 with logic shown in FIG. 5.

FIG. 6 is a diagram showing a memory map of DRAM 10 with logic shown in FIG. 5.

Referring to FIG. 6, addresses 0h to 1Fh of address space 0h to 3FFFFFh of 64 Mbit correspond to a logic control region to which a control command or data to a logic circuit 18 is written. Addresses 20h to 2Fh correspond to a logic control region to which a command or data to logic circuit 20 is written.

Thus, a memory mapped I/O space is divided into a plurality of portions for controlling a plurality of logic circuits.

Second Embodiment

Figure 7:
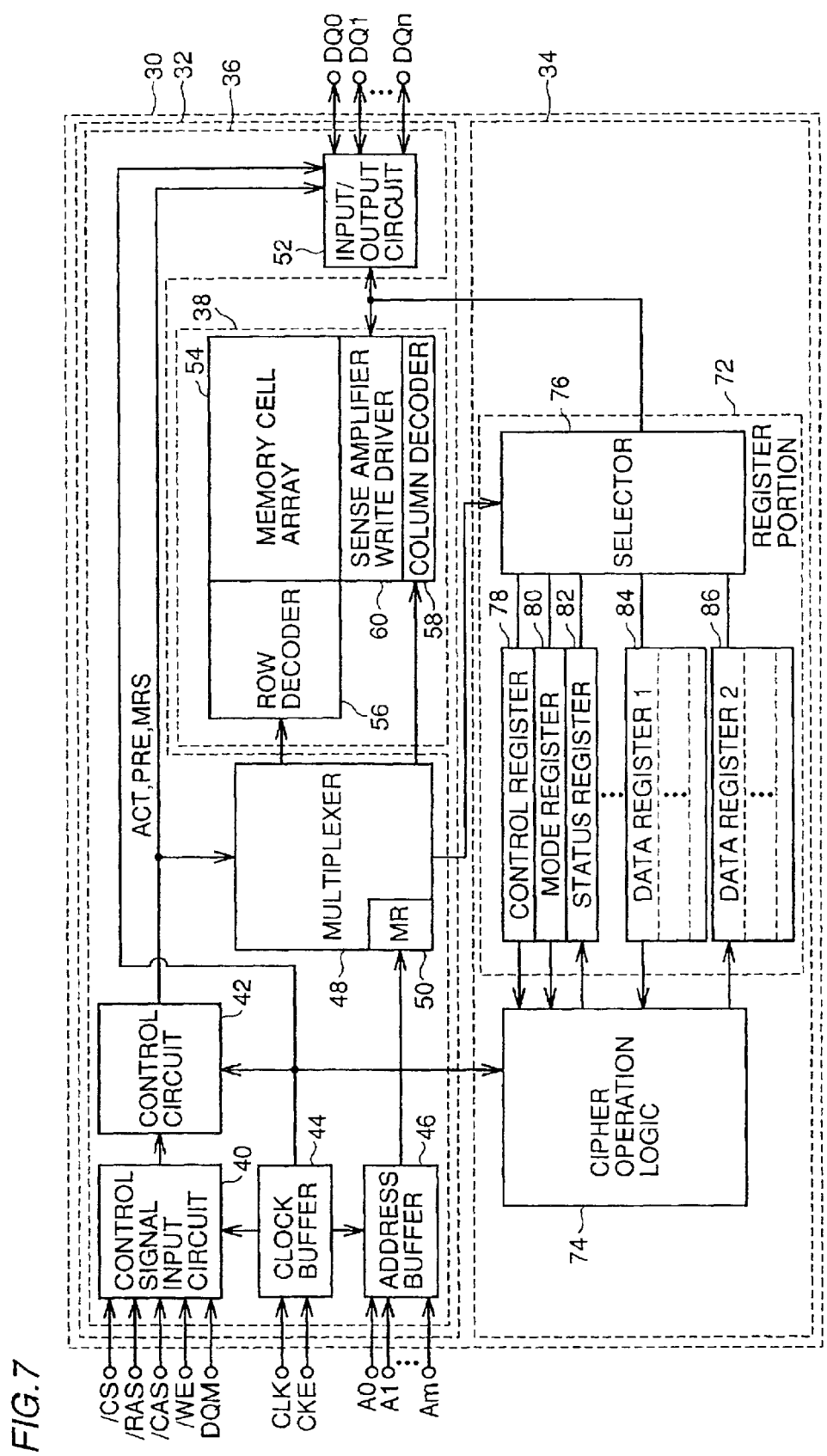
FIG. 7 is a block diagram showing a configuration of a DRAM 30 with a logic according to a second embodiment.

FIG. 7 is a block diagram showing a configuration of a DRAM 30 internally provided with a logic according to the second embodiment.

Referring to FIG. 7, DRAM 30 with logic includes an SDRAM portion 32, and a logic portion 34.

SDRAM portion 32 includes: an interface portion 36 receiving an external signal and accordingly outputting a control signal; and a DARM core 38 holding data in accordance with an output from interface portion 36. Interface portion 36 includes: a control signal input circuit 40 receiving control signals /CS, /RAS, /CAS, /WE and DQM; a clock buffer 44 receiving clock signal CLK and clock enable signal CKE for generating an internal clock; an address buffer 46 incorporating address signals A0 to An in synchronization with an output from clock buffer 44; and an input/output circuit 52 for inputting/outputting data signals DQ0 to DQn in synchronization with the internal clock.

Interface portion 36 further includes: a control circuit 42 outputting command signals ACT, PRE and the like in accordance with an output from control signal input circuit 40; and a multiplexer 48 multiplexing an output from address buffer 46 as X and Y addresses in accordance with an output from control circuit 42.

Multiplexer 48 includes a mode register 50 which can be set in accordance with a signal bit of any of address signals A0 to Am under a mode register set (MRS) command.

DRAM core 38 includes: a memory cell array 54 having memory cells arranged in a matrix; a row decoder 56 for selecting a row of memory cell array 54 in accordance with a row address applied from multiplexer 48; a row decoder 56 for selecting a column of memory cell array 54 in accordance with the column address applied from multiplexer 48; and a sense amplifier driver +write driver 60 reading/writing from/to the selected memory cell.

Logic portion 34 includes: a cipher operation logic 74; and a register portion 72 holding mode information used for controlling cipher operation logic 74, data to be input to the cipher operation logic, and an operation result of the cipher operation logic, in accordance with an output from interface portion 36.

Register portion 72 includes: a selector 76 activated when a region designated by address signals A0 to Am has a prescribed value for incorporating an externally input data signal through input/output circuit 52; a control register 78, mode register 80, and data register 84 for writing externally applied data through selector 76; and a status register 82 and data register 86 holding data output from the cipher operation logic and reading the held data as data signals DQ0 to DQn through selector 76 and input/output circuit 52.

Figure 8:
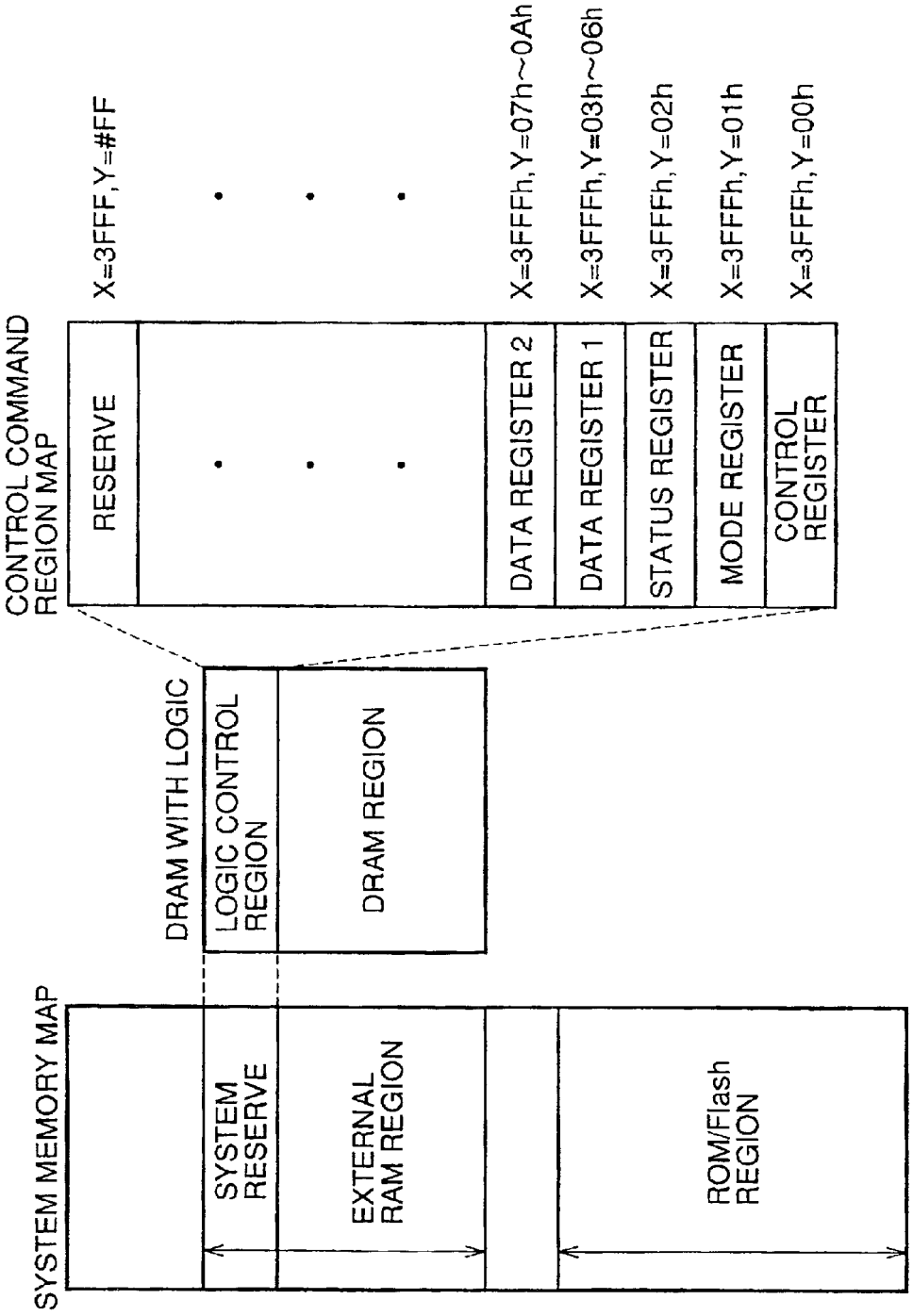
FIG. 8 is a diagram showing a memory map of a system applied to the DRAM with logic of the second embodiment.

FIG. 8 is a diagram showing a memory map of a system applied to the DRAM with logic according to the second embodiment.

Referring to FIG. 8, an external RAM region in the system memory map corresponds to the DRAM with logic. The DRAM with logic is divided into a logic control region and a DRAM region, and controls a cipher logic by accessing the logic control region. The region on the system memory map corresponding to the logic control region is a system reserved region. When a cache of a CPU and an MMU (memory Management Unit) are used, it would be a region where use of cache memory is inhibited hereinafter referred to as a cache inhibit region). To prevent an operating system from being loaded onto this region, control is preliminary performed by a firmware of the system. In addition, control is also performed so that a general application program cannot use this region.

The logic control region corresponds, for example, to row address X=3FFFh and column addresses Y=0H to FFh of the DRAM.

Control register 78 of FIG. 7 corresponds to X=3FFFh, Y=00h. Mode register 80 corresponds to X=3FFFh, Y=01h. Status register 82 corresponds to X=3FFFh, Y=02h. First data register 84 corresponds to X=3FFFh, Y=03h. Second data register 86 corresponds to X=3FFFh, Y=04h.

In this example, a page (Y=00h to FFh) of X=3FFFh is allocated to the control command region. Accordingly, when X=3FFFh is input when inputting an ACT command in the configuration of FIG. 7, the multiplexer is controlled to enable access to register portion 72. Further, an enable signal of the register or a clock for controlling the register is activated. In this way, power consumed by register portion 72 except during input of the control command can be reduced. In addition, since register portion 72 has been already activated even if a read or write command is input to the page of X=3FFFh, access to the register is not delayed.

Cipher operation logic 74 of FIG. 7 is internally provided with an accelerator of major cryptosystem used for ensuring security over a network. Cipher operation logic 74 supports a function of a public key cryptosystem used for electronic authorization and a secret key cryptosystem used for data communication after authorization. The data processing is performed by a logic circuit dedicated to encryption, so that the data processing is performed at higher speed with less power consumption than in the case of a general purpose CPU. As such, it is suitable for a battery driven system or the like.

FIG. 9 is a diagram showing cryptosystems supported by cipher operation logic 74 of FIG. 7.

Referring to FIG. 9, cipher operation logic 74 supports RSA as a public key cryptosystem, and supports DES and Triple-DES as a secret key cryptosystem. Further, in the secret key cryptosystem, each of major block encryption modes ECB (Electric Code Book), CBC(Cipher Block Chaining), OFB (Output Feed Back), CFB(Cipher Feed Back) is supported. Cipher operation logic 74 performs a critical process for encryption to enhance adaptivility of the application. The other processes are performed by a software on the side of the microcomputer controlling DRAM 30 with logic. The most remarkable feature is that cipher control can be implemented in a pin-compatible manner with a general purpose SDRAM.

Now, allocation to each register in the logic control region shown in FIG. 8 will be described.

FIGS. 10 to 18 are diagrams shown in conjunction with data allocated to the register.

Referring to FIGS. 7 and 10, for control register 78 corresponds to 16 bits of D0 to D15 stored at Y=0h. An encryption function is reset by writing 1 to bit D0. Namely, a process of applying a reset pulse corresponding to a prescribed period of time to cipher operation logic 74 is performed. When bit D1 is 1, it means that cipher operation logic 74 is in a process of encryption. Thus, when externally accessing the cipher operation logic, it must be confirmed that a flag applied to bit D1 is 0 before accessing.

Control register 78 is used for both the public and secret key cryptosystems.

Next, several exemplary registers used for control in the secret key cryptosystem will be described.

Referring to FIGS. 7 and 11, for an address Y=1h, a mode register 80 is allocated. Bits D1 and D0 of 16 bits are used for selection of the cryptosystem. If these two bits are "01," the encryption method is DES. If they are "10," the encryption method is triple DES. If they are "00," the encryption method is held.

Bits D5 to D2 are used for selection of a block encryption mode. If the bits are "0001," ECB is designated as the block encryption mode. If they are "0010," CBC is designated. If they are "0100," OFB is designated. If they are "1000," CFB64 is designated. If they are "0000," the block encryption mode is held.

Bits D8 to D6 are used for selection of a data process mode designating a unit amount during an encryption process. If these bits are "001," a normal mode is designated in which the process is performed with a unit of 8 bytes. If they are "010," a block mode is designated in which the process is performed by a block unit used for designation of the block length. If they are "100," a buffer mode is designated in which information stored in the buffer is collectively processed as a unit. If they are "000," the data process mode is held.

Thus, 16 bits of 1 address and 2 bytes data at Y=1h can be allocated to a plurality of modes. Accordingly, even if there are a plurality of modes to be designated, by effectively utilizing combinations of $2^{16}$, the designation of the operation mode can be performed by a single access.

Referring to FIGS. 7 and 12, status register 82 corresponds to address Y=02h. For bits D1 and D0 of the status register, "01," "10," and "00"respectively represent encryption, decryption and holding. For bits D5 and D4, "01," "10" and "00"respectively represent starting input of a plain text or cryptogram, stopping input, and holding.

Bit D9 to D6 represent a text length in one block of OFB, CFB.

Referring to FIGS. 7 and 13, Y addresses 3h to 6h correspond to a region in which a key of DES having 64 bits or the like is stored.

Figure 14:
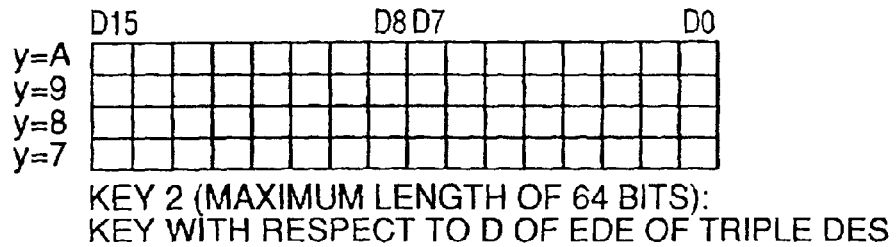

Referring to FIGS. 7 and 14, first data register 86 corresponds to a region in which a key used for Triple-DES is stored. It corresponds to the region at addresses Y=7h to Ah.

Although each of data registers 84 and 86 looks like a single register, it is actually formed of a plurality of registers, being a kind of first in first out (FIFO) memory.

Figure 15:
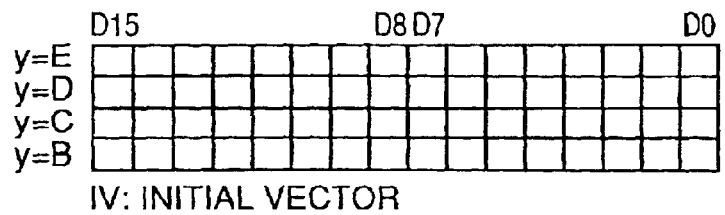
Figure 16:
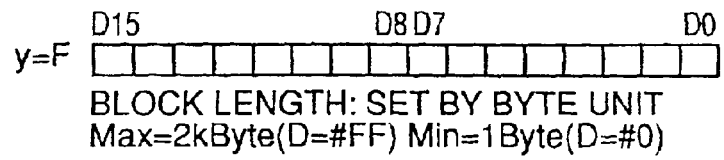
Figure 17:
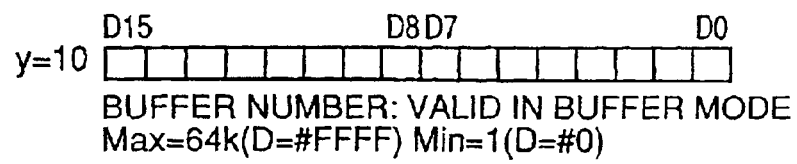
Figure 18:
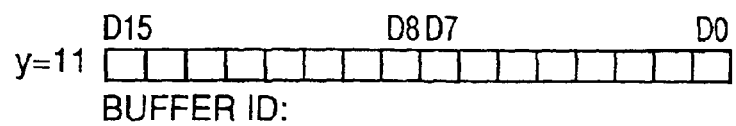

Examples of registers include a register for setting an initial vector as shown in FIG. 15 although not shown in FIG. 7, a register for setting a block length as shown in FIG. 16, a register for designating the number of buffers as shown in FIG. 17, a register for indicating buffer ID as shown in FIG. 18 and the like.

It is noted that, for a public key method, e.g., an RSA encryption process, the region of Y=12h to 1Fh is reserved. In the case of the public key method, a result of an encryption process is held in the internally provided register, so that access to the DRAM region is permitted even during encryption.

When row address X read by the ACT command with respect to the SDRAM is 3FFFh, multiplexer 48 detects it and activates selector 76. Then, the register to be accessed is selected when column address Y is input by the read command or write command. Then, externally input data is written to the register through input/output circuit 52.

In the second embodiment, the address region designated as the logic control region is 3FFF00h to 3FFFFFh. However, the DRAM with logic of the present invention can be mounted on various microcomputer systems if addresses to be allocated can be changed in the multiplexer in accordance with the content of register 50 of FIG. 7 which can be set by a mode register set instruction. If the addresses are not allocated by the mode register set instruction, the DRAM with logic of the present invention can be used as a general 64 M-bit SDRAM. For use as a general SDRAM, a bit for determining if the internal logic is to be used or not may be added in the mode register.

Third Embodiment

Figure 19:
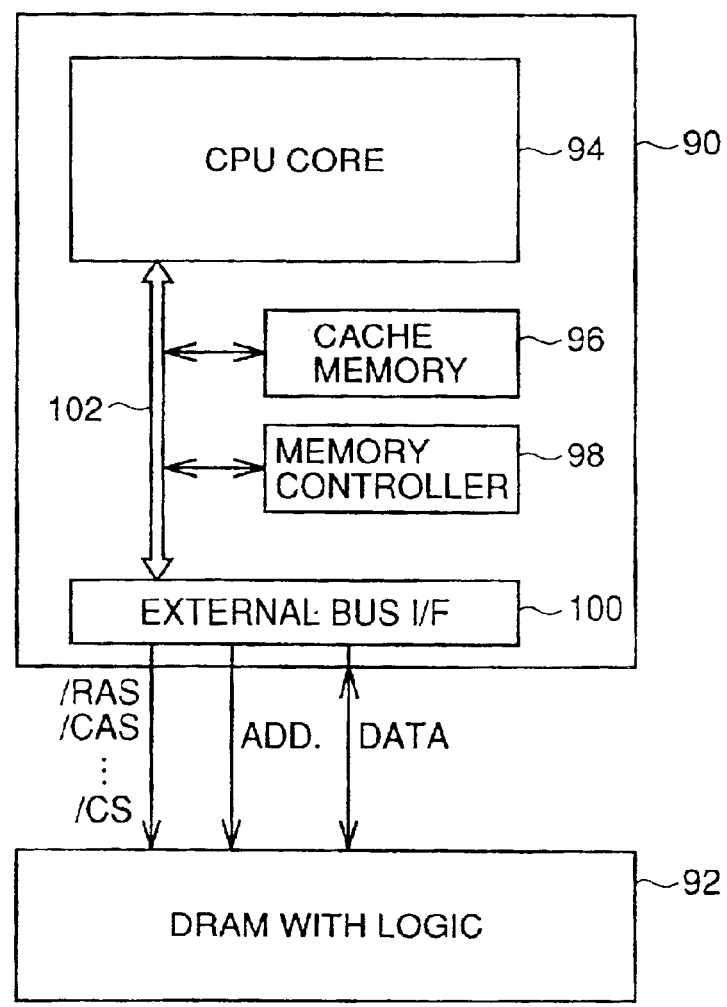
FIG. 19 is a diagram showing that a DRAM 92 with a logic of the present invention is connected to a microcomputer 90.

FIG. 19 is a diagram showing that DRAM 92 with logic of the present invention is connected to microcomputer 90.

Microcomputer 90 includes a CPU core 94, a cache memory 96, a memory controller 98, and an external bus interface circuit 100, which are interconnected by an internal bus 102. External bus interface circuit 100 outputs a control signal, address signal, and data to the DRAM with logic in accordance with an instruction from CPU core 94. Thus, external bus interface circuit 100 and DRAM with logic 92 are connected by a control signal bus for transmitting control signals /RAS, /CAS, . . . , /CS and the like, an address bus for transmitting address signal ADD. and a data bus for transmitting data DATA.

To control DRAM 92 with logic in such a system, attention must be paid to some features of a software operating on microcomputer 90.

Figure 20:
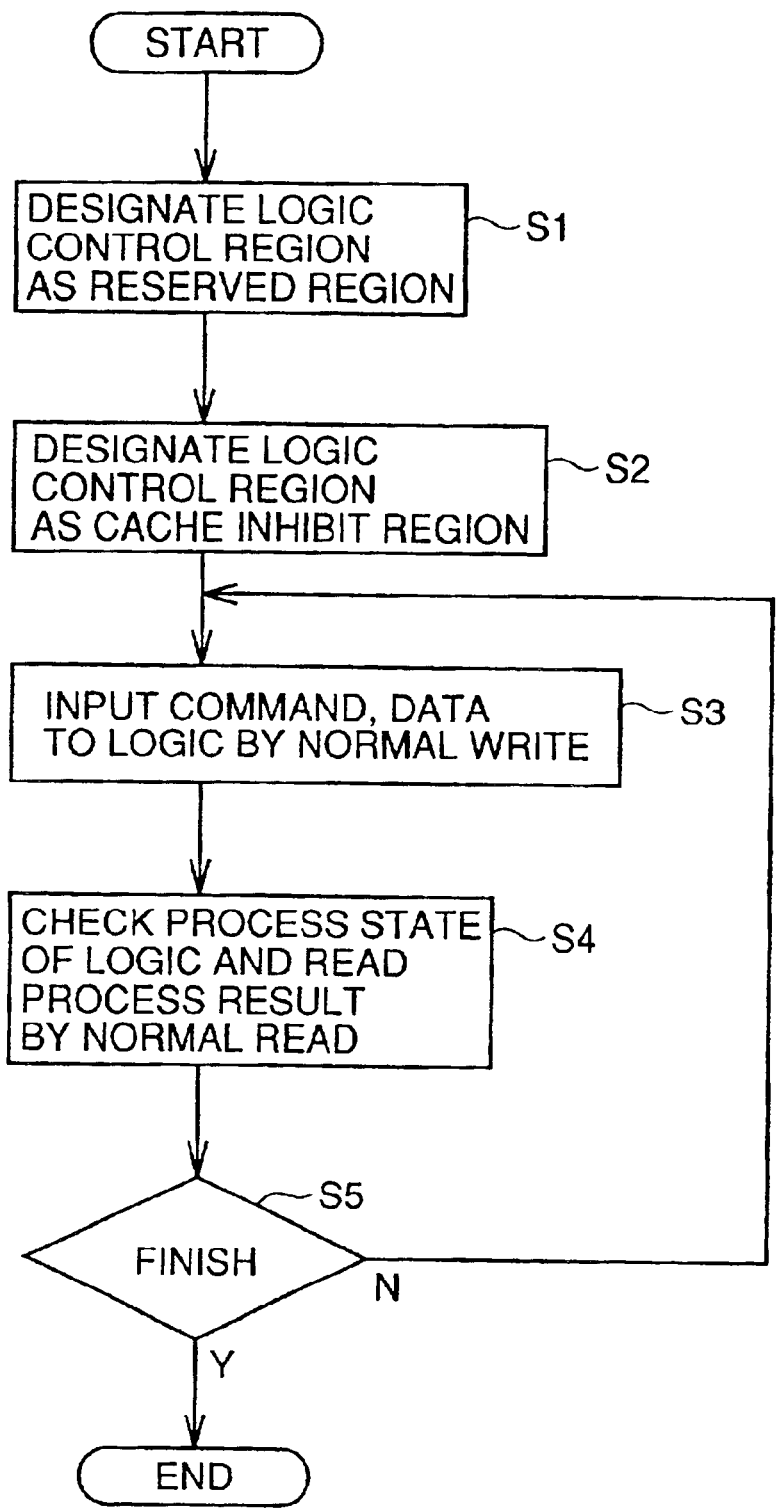
FIG. 20 is a flow chart showing a process of controlling the DRAM with logic.

FIG. 20 is a flow chart showing a control process of the DRAM with logic.

Referring to FIG. 20, first, at a step S1, an address for a logic control region is allocated to a reserved region. Namely, it is prevented that a program is allocated onto an address space for controlling a command with respect to a logic circuit. For this purpose, the logic control region can be designated as the reserved region with use of a function of an OS (Operation System), for example.

Care must be also paid at the start of the OS to prevent allocation to the logic control region of a kernel per se, which is a core of the OS for performing basic control of the system such as memory management, interruption management and communication between processes. Accordingly, the reserved region is designated on the side of the OS while paying attention to prevent allocation of the kernel per se to the logic control region.

Then, in a step S2, the logic control region is designated as a cache inhibit region in a system with a data cache.

Namely, even if a prescribed address space is designated and data corresponding to a command is transmitted to internal bus 102 with respect to DRAM 92 from CPU core 94 in FIG. 19, operation of a cache memory 96 may cause data corresponding of that command to be written to cache memory 96 and not transmitted to DRAM 92 with logic. In this case, the logic circuit of DRAM 92 is prevented from performing its operation in accordance with the command. Thus, a setting must be made to prevent cashing of the logic control region. In most microcomputers, control for designating a part of address space as an uncachable region.

If a memory management unit function is provided, a setting is made to prevent use of a virtual address space in the logic control region.

Thus, in a system with a cache memory, it is set, at the initial setting of the system, that use of the cache memory is prevented for the logic control region of the DRAM and access thereto is always assured.

Then, in a step S3, normal write to the allocated region allows a command to be input for logic control. In a step S4, normal read enables checking of a processing state of the logic or reading of the processing result. Further, if the process has not yet been finished in a step S5, steps S3 and S4 are repeated. More specifically, as stated in conjunction with FIG. 10, by checking a flag which has been written to bit D1 at address Y=0h, the process state can be determined. By checking this flag, the microcomputer can confirm completion of the process to move onto the next step of for example, access to the operation result.

Accordingly, the present invention enables checking of the flag state by general normal read with respect to the SDRAM, while the completion of the process is conventionally notified to the receiver by dedicated pins.

Fourth Embodiment

In the first to third embodiments, a part of the space of the DRAM memory mounted on the chip is designated as a space for controlling a command. Thus, the allocated portion cannot be used as a main memory of the microcomputer system.

In the fourth embodiment, a ghost space is designated for control.

Figure 21:
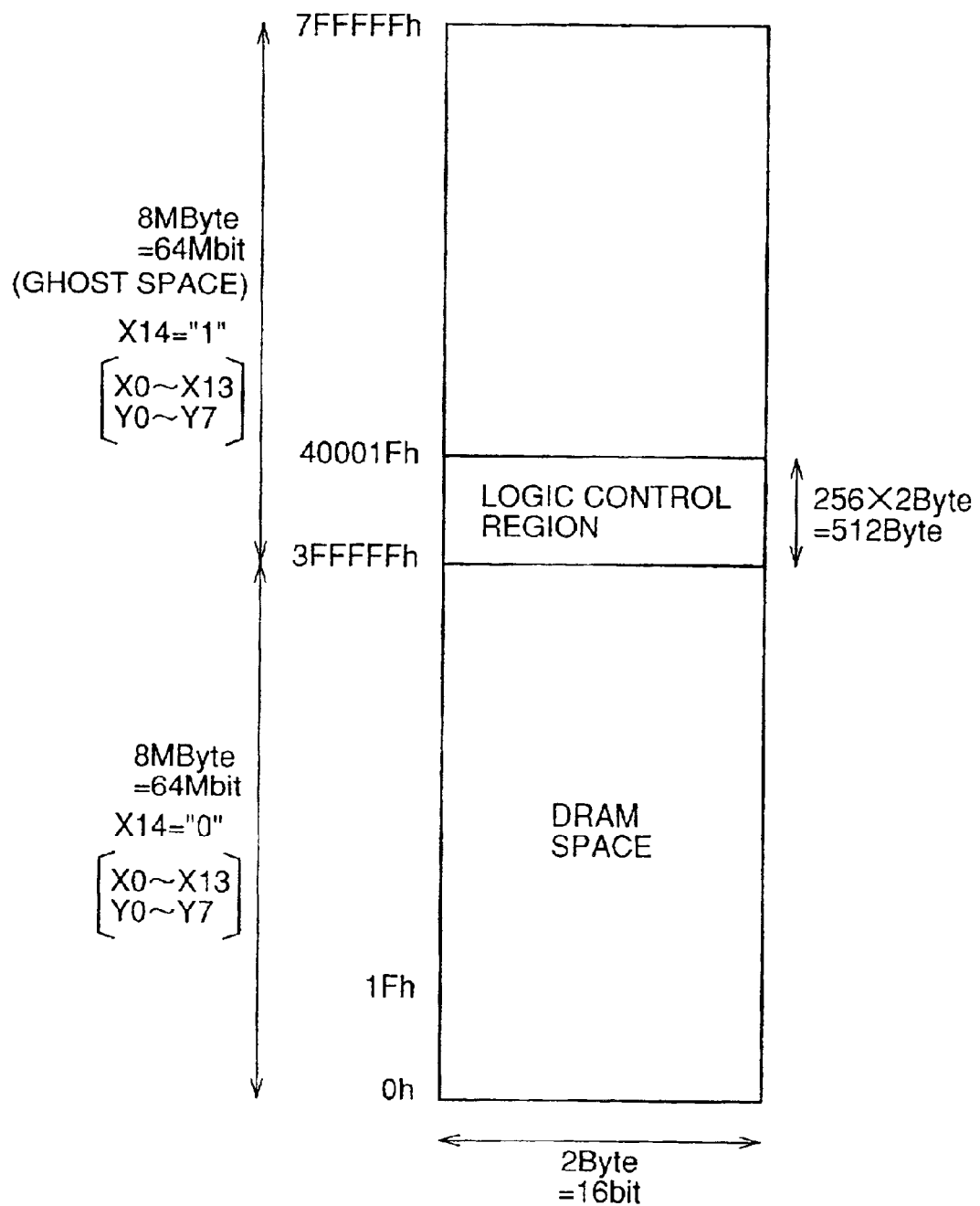
FIG. 21 is a diagram showing a memory map according to a fourth embodiment.

FIG. 21 is a diagram showing a memory map of the fourth embodiment.

Referring to FIG. 21, given that a DRAM used is an SDRAM having a capacity of 64Mbit and a bus width of 16 bits, X addresses are X0 to X13, and Y addresses are Y0 to Y7. One more terminal of X address is added, where a region of X14="0" is a real memory space, and a region of X14="1" is a ghost space. A part of this dummy ghost space without any memory is designated as the logic control region. Some measures are taken for the space to assure direct access as described in the third embodiment.

One additional terminal for X14 is used, but an unused terminal, if any, of the package may be used. For example, NC terminals such as pins 40 and 36 of FIG. 53 may be used. Although address X14 is added in FIG. 21, 1 bit of Y address may be added. Namely, the region of Y8=0 may be used as a DRAM space, and the region of Y8=1 as a ghost space. In the DRAM, X and Y addresses are generally multiplexed and the X address has a greater number of bits. Thus, when the Y address is added, no additional terminal is necessary.

In the foregoing description, the logic control region is allocated to a portion of the ghost space. If the ghost space is read, an operation may be performed on data stored at an address of the corresponding real space for output, or the data at that address may be changed. More specifically, if access is made with X14=1, a some kind of data processing may be performed on data in the real space at the corresponding address of X14=0. In this case, Y8 address may be added instead of X14 address. Although X14=1 corresponds to a ghost space, X14=0 may correspond to the ghost space and X14=1 may correspond to the real memory space. In the case of adding Y8 address, similarly, Y8=0 may correspond to the ghost space and Y8=1 may correspond to the real memory space.

Fifth Embodiment

Figure 22:
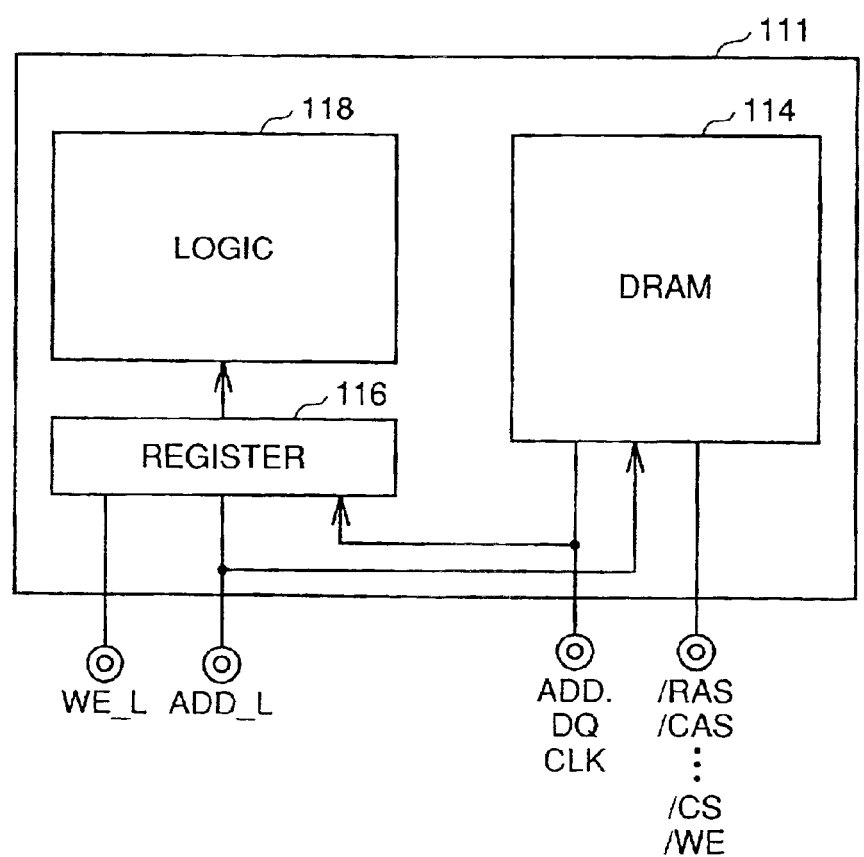
FIG. 22 is a diagram showing a configuration of a DRAM 11 with a logic according to a fifth embodiment.

FIG. 22 is a diagram showing a configuration of a DRAM 111 internally provided with a logic according to the fifth embodiment.

Referring to FIG. 22, DRAM 111 with logic includes a terminal for applying signals WE_L, ADD_L, in addition to terminals for controlling an address ADD., data DQ, clock signal CLK, and control signals /RAS, /CAS, . . . , /CS, /WE for controlling a general DRAM 114.

DRAM 111 with logic further includes a general DRAM 114, a register 116 holding a prescribed control signal, and a logic circuit 118 operating based on held information in register 116.

Namely, a control space can be freely set with a minimum number of terminals for control. In FIG. 22, an additional control terminal is used for inputting control signals WE_L, ADD_L. The additional terminals may be allocated to NC pins such as 36 pin or 40 pin shown in FIG. 53.

When control signal ADD_L is at an L level, a DRAM access mode is set. When control signal ADD_L attains to an H level, DRAM 114 is inactivated and register 116 is enabled to receive signals and logic 118 enters an operation mode.

Figure 23:
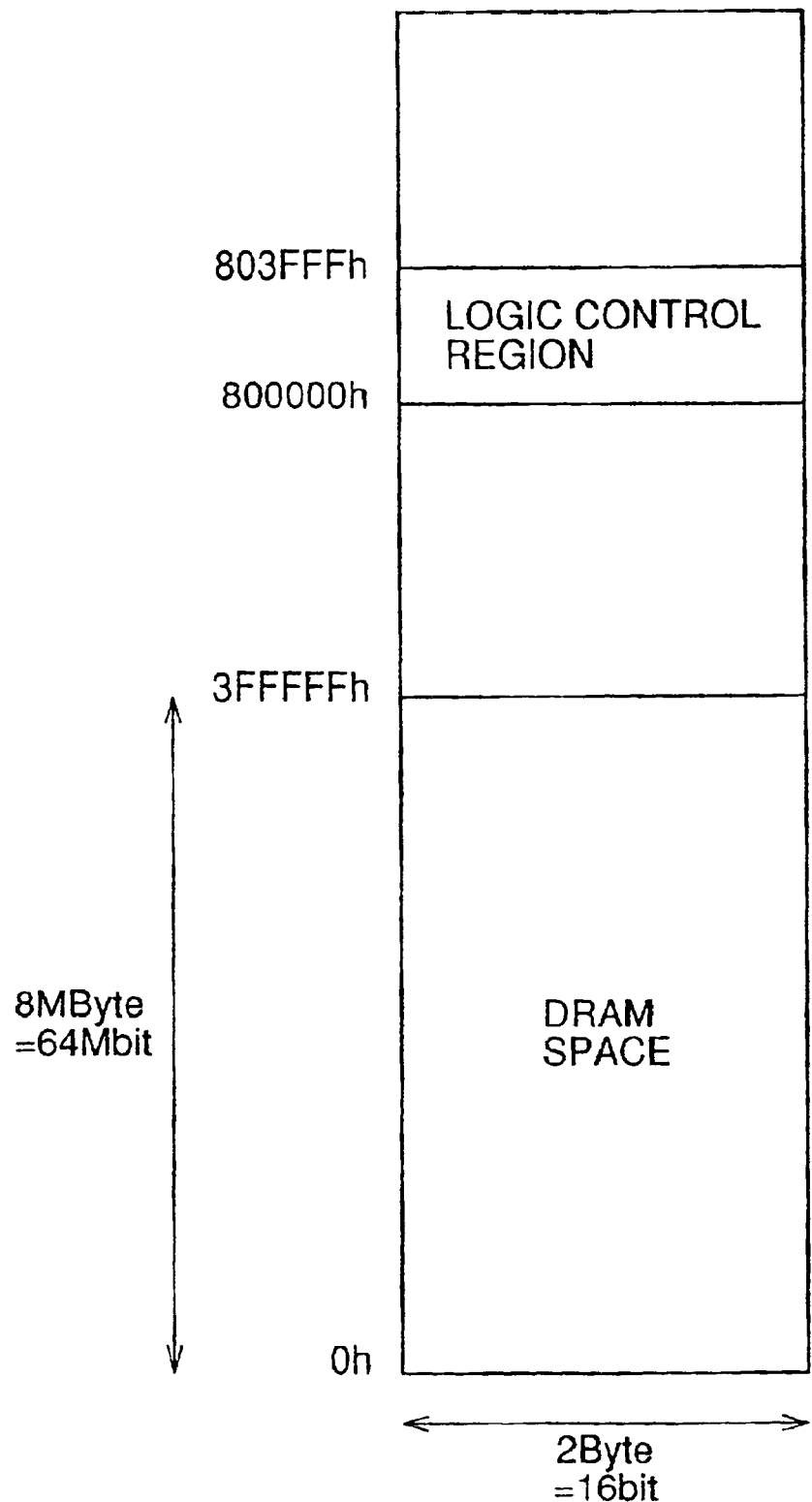
FIG. 23 is a diagram showing a memory map of a microcomputer system of the fifth embodiment.

FIG. 23 is a diagram showing a memory map of a microcomputer system according to the fifth embodiment.

Referring to FIG. 23, 0h to 3FFFFFh are allocated to a DRAM space. There are 14 bits of X addresses X0 to X13 and 8 bits of Y addresses Y0 to Y7. As address bits used for designating the DRAM space in the microcomputer system, A0 to A21 can be used in total.

Then, when the terminal used for inputting control signal ADD_L is connected to an address bit A23 of the microcomputer system, 800000h to 803FFFh can be allocated to the logic control region. More specifically, a range allocatable to the logic control region refers to a range enabling designation as X addresses of the DRAM by the maximum number of terminals used for inputting addresses, i.e., 0h to 3FFFh. This is the maximum range which can be designated as address when the address bit A23 is set to "1" and the address multiplex method is not used. In practical use, the ceiling of the logic control region may be set as necessary.

Note that, if there is a possibility that the microcomputer may use another address region which is designated with address bit A23="1," a chip select signal /CS must be activated with respect to the DRAM with logic only when accessing the logic control region (80000h to 803FFFh).

Figure 24:
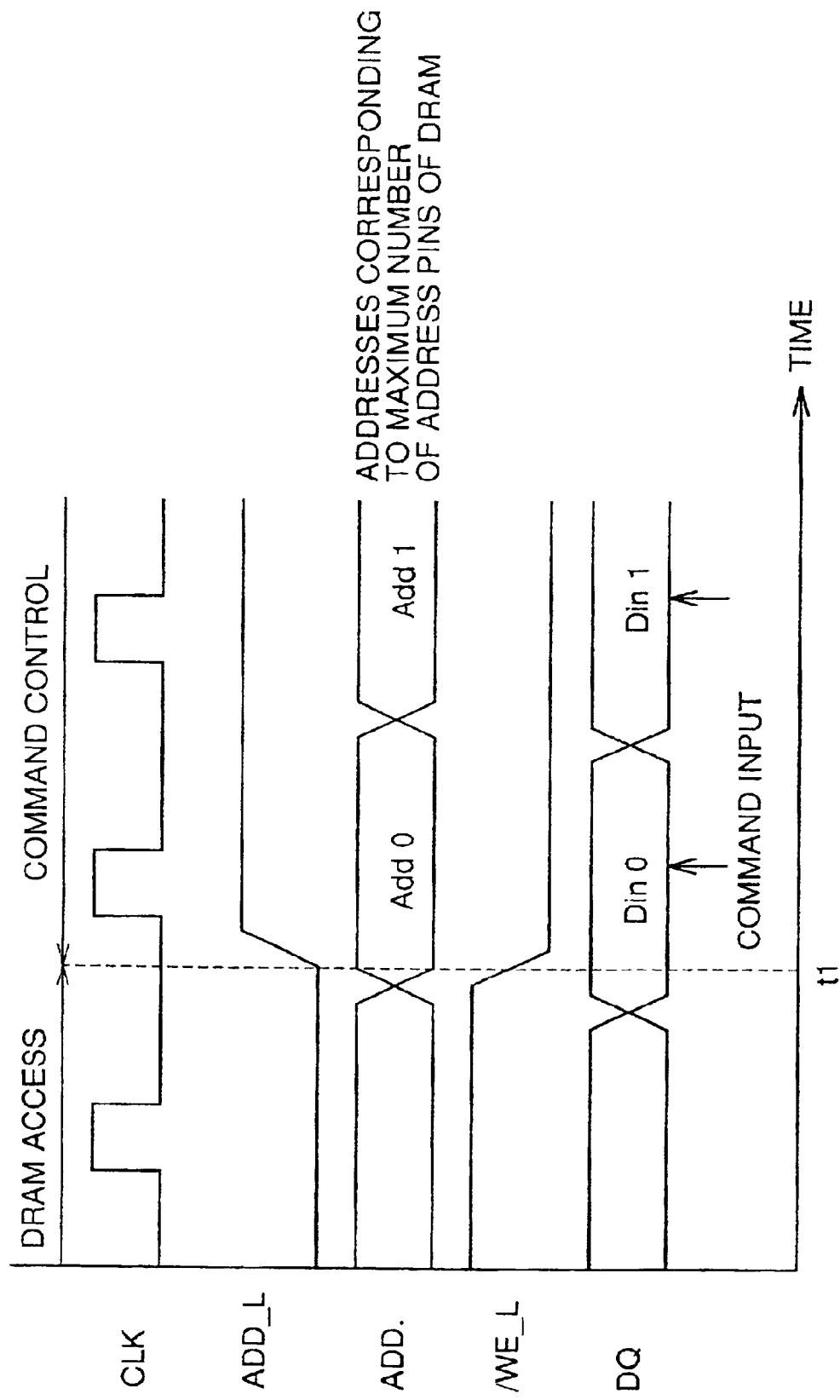
FIG. 24 is a diagram showing operation waveforms shown in conjunction with control of the DRAM with logic according to the fifth embodiment.

FIG. 24 is a diagram showing operation waveforms for controlling the DRAM with logic according to the fifth embodiment.

Referring to FIG. 24, general access to the DRAM is performed in synchronization with a clock signal CLK before a time t1.

When control signal ADD_L attains to the H level at t1, a command control mode with respect to the logic circuit is entered. Subsequently, data is input/output with respect to a register designated by address signal ADD in synchronization with clock signal CLK. In the case of FIG. 24, added control signal /WE_L is at the L level, so that a command is input to a register for controlling a command.

Modification of the Fifth Embodiment

Figure 25:
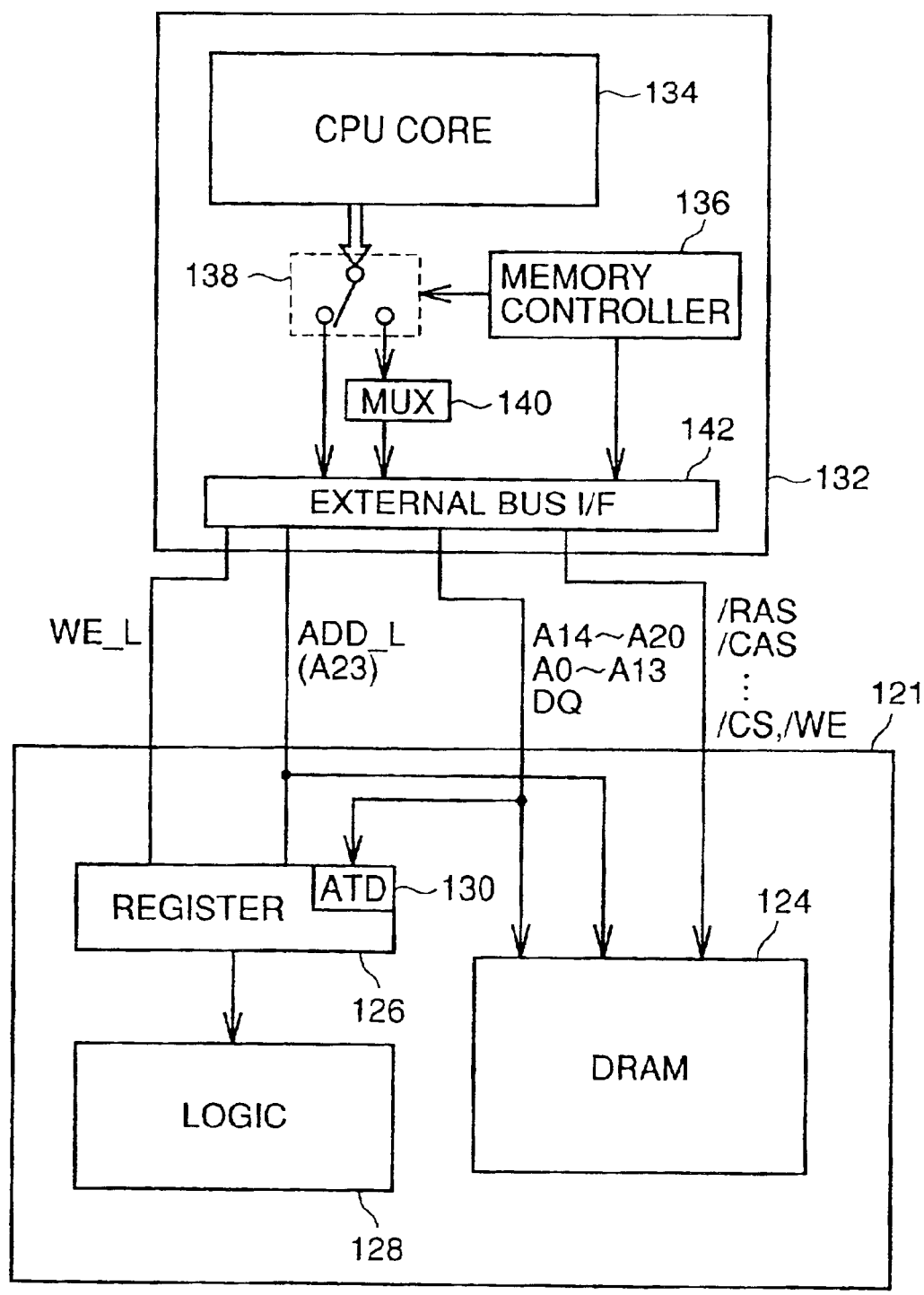
FIG. 25 is a diagram shown in conjunction with a modification of the fifth embodiment.

FIG. 25 is a diagram showing a modification of the fifth embodiment.

When a microcomputer 132 accesses an address space of a general DRAM, a memory controller 136 multiplexes and outputs an address designated by CPU core 134 to an address bus transmitting address signals A0 to A13 using a multiplex circuit 140.

However, as shown in FIG. 23, if the logic control region is allocated to a region different from the DRAM space, memory controller 136 directly outputs the address from external bus interface circuit 140 without using multiplex circuit 140.

In this case, the address is designated by a method similar to that employed in the SRAM using address signals A0 to A14 of address signals A0 to A20, which correspond to the number of pins made valid after being multiplexed. Then, signals A14 to A20 are in a so-called "Don't' Care" state, i.e., they may be in any state. When such address signals A0 to A20 are designated upon activation of /CS, DRAM 121 with logic performs a process.

Note that, if there is a possibility that the microcomputer may use another address region of address bit A23="1", chip select signal /CS must be activated with respect to the DRAM with logic only when accessing the logic control region (800000h to 803FFFh).

In such a case, DRAM 121 is provided with an ATD (Address Transition Detect) circuit 130 which detects a transition in address at a part of register 126.

Figure 26:
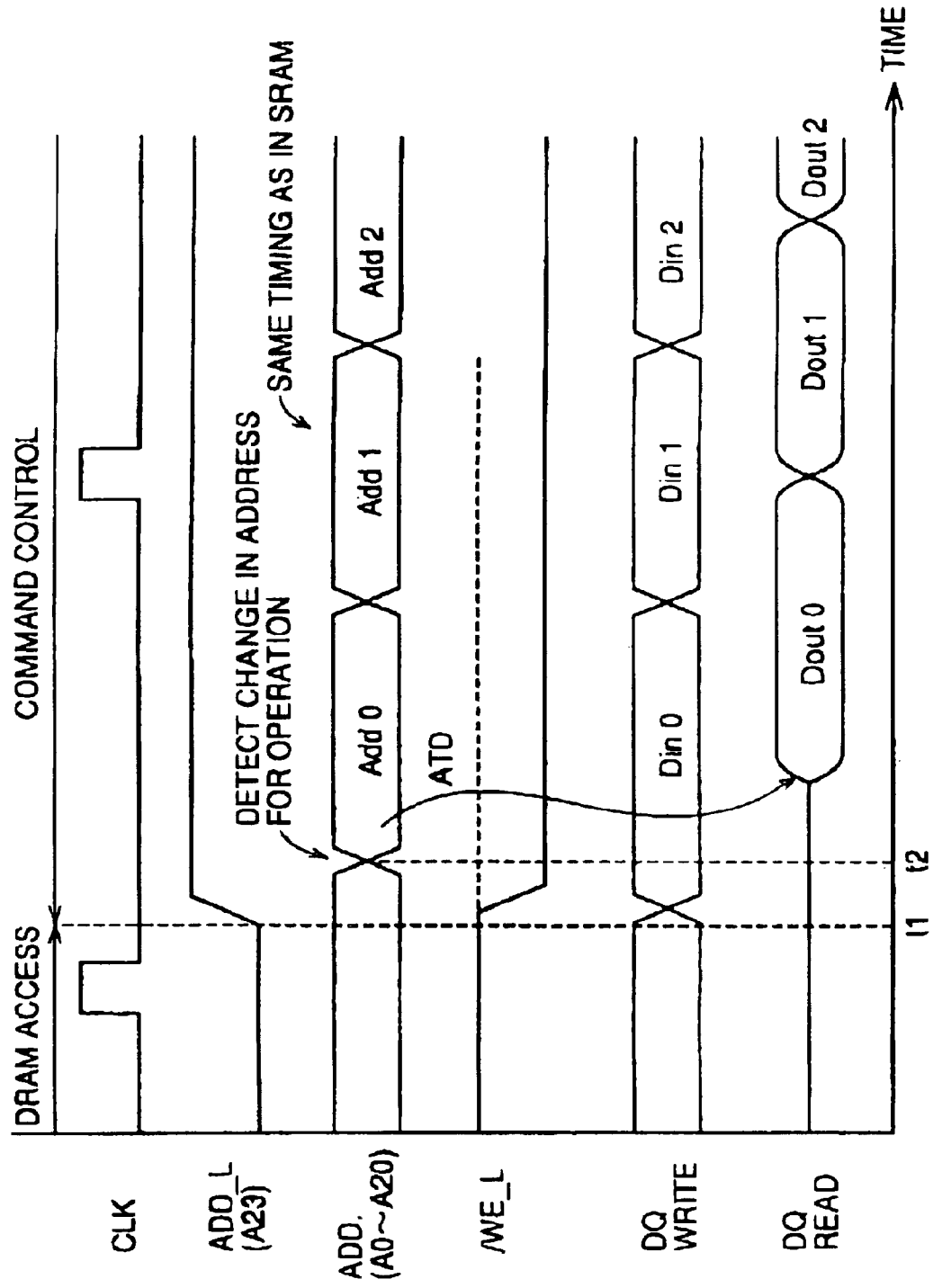
FIG. 26 is a diagram showing operation waveforms shown in conjunction with the operation of the modification of the fifth embodiment.

FIG. 26 is a diagram showing operation waveforms used for explaining the operation of the modification of the fifth embodiment.

In this case, before t1, control signal ADD_L is at the L level and a general access to the DRAM is performed. When ADD_L attains to the H level, a command control mode with respect to the logic circuit is entered. At the time, if /WE_L is at the L level, a write mode is designated. If /WE_L is at the H level, a read mode is designated.

When an address ADD designated by address signals A0 to A13 is changed, ATD circuit 130 detects the change and generates an internal operation clock independent of clock signal CLK for writing a signal applied to DQ to an internal command register or reading the content of the register designated by the address from the DQ terminal.

As described above, by connecting a terminal for receiving control signal /WE_L of semiconductor memory device 121 and a terminal for outputting a signal A23 which is output for controlling the SRAM on the side of microcomputer 132, the need for a special functionality on the side of the microcomputer is eliminated if semiconductor memory device 121 is controlled as the SRAM. The microcomputer can control the logic circuit in semiconductor memory device 121 if a general command for writing or reading data with respect to a memory such as an external extended SRAM is executed.

Sixth Embodiment

In the sixth embodiment, a more specific DRAM internally provided with a cipher logic will be described. The DRAM with the cipher logic will be hereinafter referred to as a security SDRAM (ScRAM).

Figure 27:
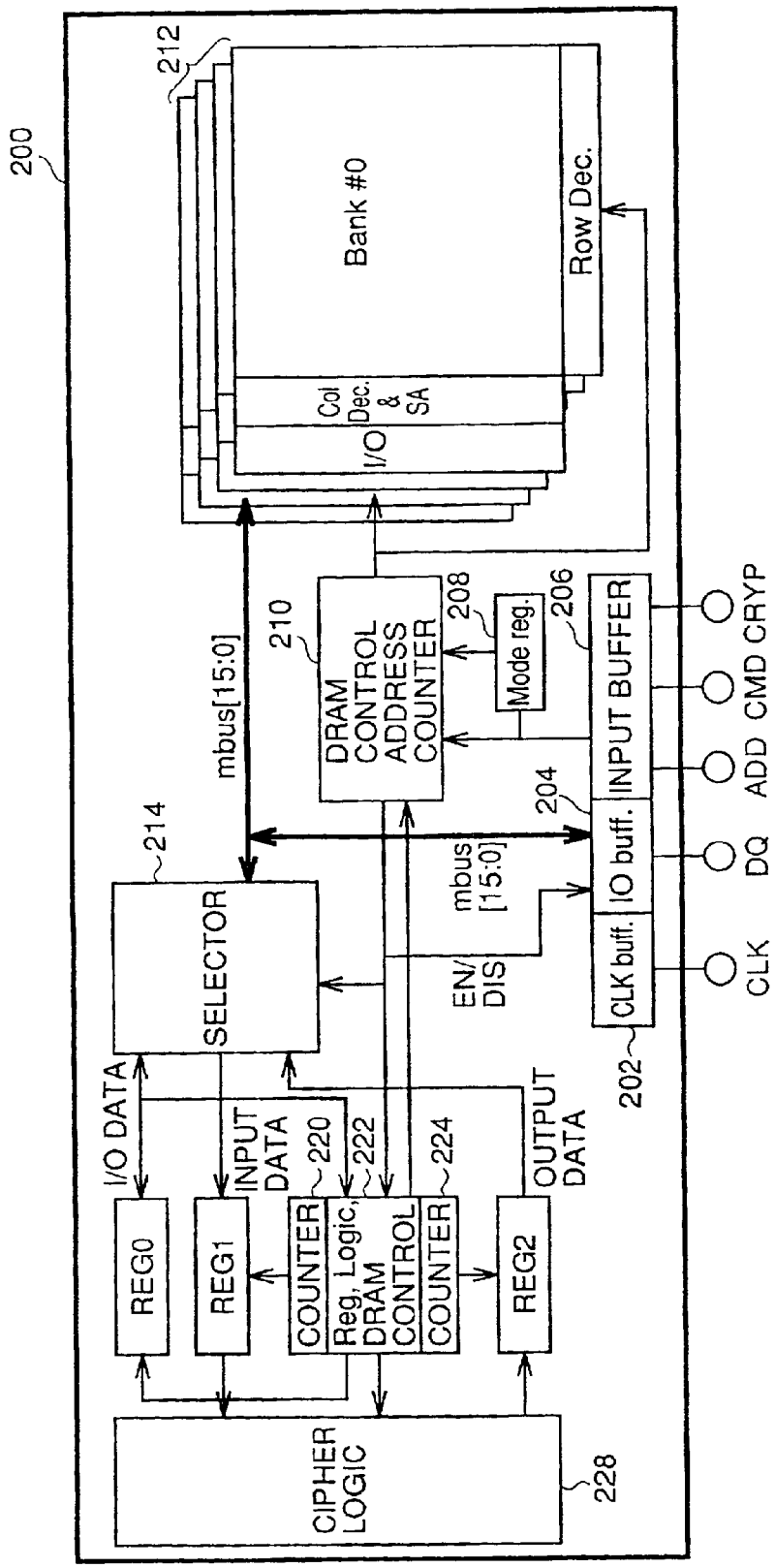
FIG. 27 is a block diagram showing a configuration of ScRAM200.

FIG. 27 is a block diagram showing a configuration of an ScRAM 200.

Referring to FIG. 27, ScRAM 200 includes: a clock buffer 202 receiving an external clock signal CLK; an input/output buffer 204 for transmitting/receiving a data signal DQ to/from an external portion; and an input buffer 206 externally receiving an address signal ADD, command signal CMD, and signal CRYP.

ScRAM 200 further includes: a mode register 208 holding operation mode information in accordance with an output from input buffer 206; a DRAM control address counter 210 for controlling the ScRAM in accordance with the outputs from input buffer 206 and mode register 208; and a DRAM portion 212 performing a data holding operation under control of DRAM control address counter 210.

Input/output buffer 204 and DRAM portion 212 are connected by an internal bus mbus [15:0]. DRAM portion 212 has a plurality of banks, each including a memory array, row decoder, column decoder, sense amplifier, and input/output control circuit.

ScRAM 200 further includes a selector 214, registers REG0, REG1, REG2, counters 220, 224, a control circuit 222, and a cipher logic 228.

Parameters at the time of mode register set (MRS) which is a control command for the SDRAM are stored in mode register 208. Not only the mode setting of the SDRAM, but also the setting of enable/disable of access to control registers REG0 to REG2, can be designated to be stored. When the MRS command is input, control registers REG0 to REG2 and cipher logic 228 are reset.

ScRAM 200 has three types of control registers REG to REG3 for controlling a cipher logic function.

Control register REG0 is used for holding a command or a mode that controls a cipher logic. Control register REG1 is used for holding an input data of the cipher logic. Control register REG1 has a maximum capacity of 4 kb.

Control register REG is used for holding an output result of the cipher logic. Control register REG2 also has a maximum capacity of 4 kb.

Now, a method of accessing control registers REG1 to REG2 will be described.

By accessing the control register from an external portion, control of the cipher logic in ScRAM 200, input/output of data, and control a mode for lower power consumption can be performed.

Figure 28:
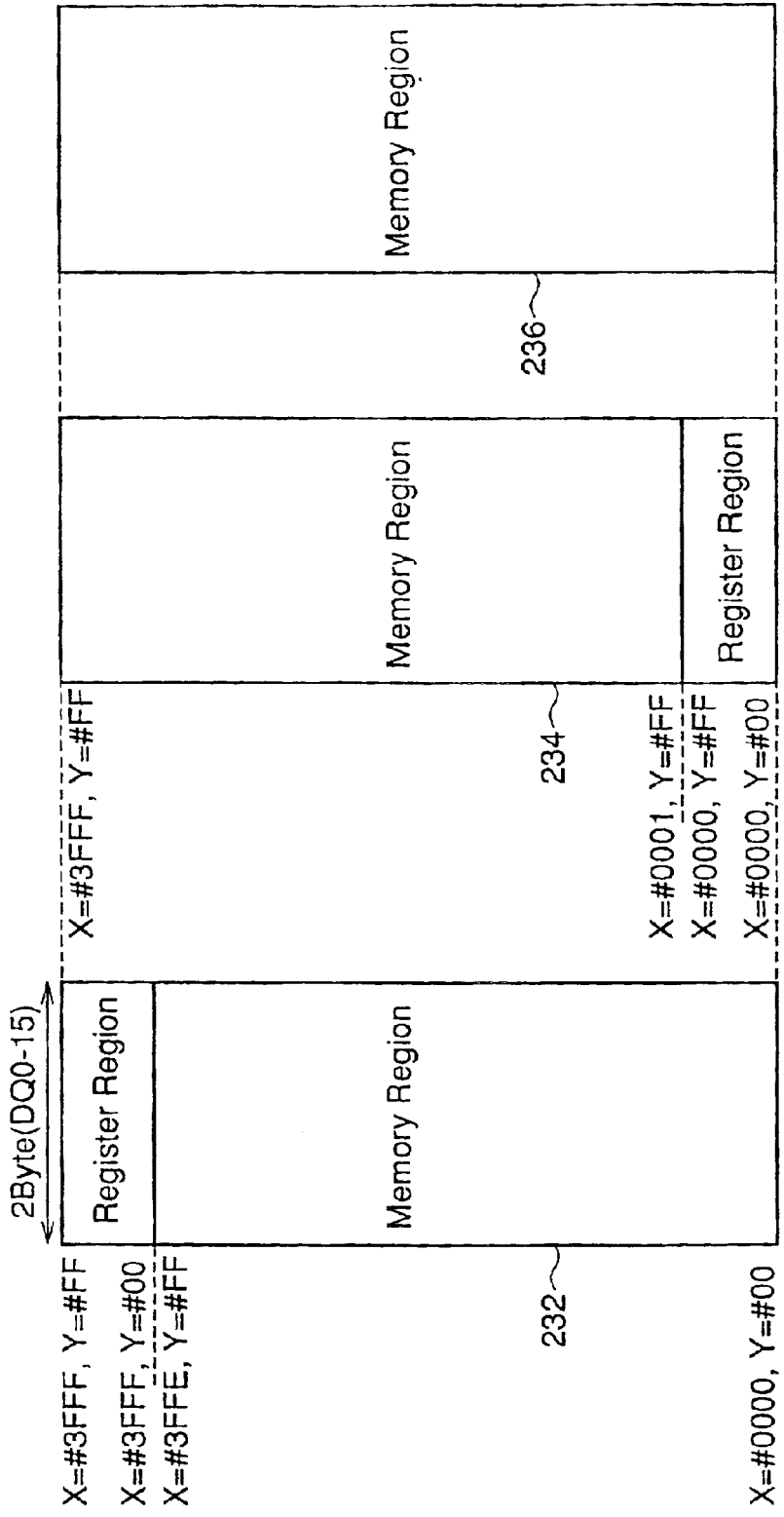
FIG. 28 is a diagram shown in conjunction with a transition in the state of a memory map according to a setting of a control register.

FIG. 28 is a diagram shown in conjunction with a change in the state of a memory map according to the settings of the control register.

Referring to FIG. 28, there are two methods of controlling the cipher function of the ScRAM.

In the first method, 1 is externally input as a control register access enable signal CRYP. Thus, a page of X=#3FFF becomes a control register region.

In the second method, if control register access enable signal CRYP has 0, 1 is input as address bit A10 when an MRS command for setting the mode of the SDRAM is input. In this case, if address bit A11 has 0, the page of X=#3FFF becomes a control register region. When address bit A11 is 1, a page of X=#0000 becomes a control register region.

When the control register of the ScRAM is not used, by setting 0 to A10, a general MRS command for setting the mode of the SDRAM is input. In this case, control register accessing enable signal CRYP must be 0. When tRSC is elapsed after the input of signal CRYP and MRS command, the ScRAM can operate with respect to new commands.

When access to the control registers is enabled, by writing/reading predetermined data to the address space of a specific row address (X =#3FFF or X=#0), control registers REG0 to REG2 can be accessed. During that time, 4-kbit address space allocated to logic control cannot be used as a memory. The other part of the space can be externally accessed as a general memory region.

Here, if the address space for the control register access is externally accessed, DRAM portion 212 would not be accessed. Thus, once the enable state of the control register access ends, the memory space corresponding to the specific row address in the control register region can be accessed as a general memory space. The value which has been set to the register before the end of enable state of the control register access is finished is held if the operation mode is finished by setting signal CRYP to 0. However, if the operation state is finished by using the MRS command, the value which has been set to the register is reset. Namely, the register can be reset by inputting the MRS command.

Control registers REG0 to REG2 can be accessed by access in the same sequence as that of a general purpose SDRAM in the address space allocated to the control registers. Read data from the control registers are output with the same CAS latency which is set at the time of setting the mode register of the SDRAM, however, the burst length at the time of accessing the control registers is fixed at 1.

Now, mode register 208 of FIG. 27 will be described.

Figure 29:
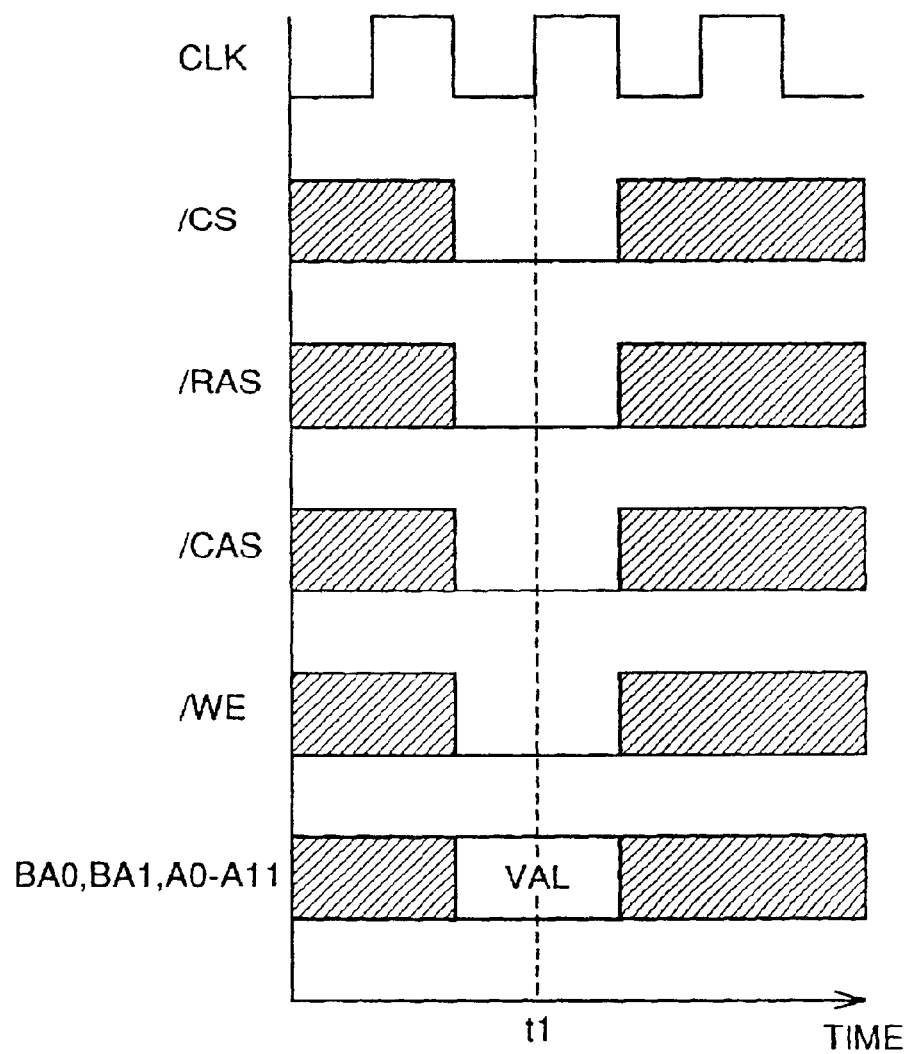

FIGS. 29, 30 and 31 are diagrams shown in conjunction with mode register 208 of FIG. 27.

Referring to FIG. 29, a mode register setting instruction is applied by setting all of signals /CS, /RAS /CAS and /WE of command signal CMD to an L level at the time of the rise of a clock signal CLK. The values set by address bits BA0, BA1, and A0 to A11 included in address signal AD are written to respective bits shown in FIG. 30. Note that address bits A8 and A7 are set to 0. The other bits are allocated to various settings as shown in FIG. 31.

The mode register enables the mode setting of the SDRAM, setting of the low power mode of the SDRAM, and access to the control registers.

In mode setting of the SDRAM, the burst length, burst type and /CAS latency can be programmed.

In setting the low power mode of the SDRAM, precharge standby current in non-power down mode can be reduced. Note that, use of this mode requires the setup time of the input signal of at least 5 ns.

In accessing the control registers, if bit A10 is set to 1 at the time of mode register setting, a register space for controlling a cipher function is obtained. This method does not enable control of a terminal for inputting signal CRYP, and hence is suited to a system with the terminal being fixed to 0. The control registers are accessed in the same access sequence as the SDRAM and data is output with the same /CAS latency. However, the burst length is always fixed to 1 in accessing the control registers.

The data set by the mode register set is stored in the mode register until the next MRS command is input. The next MRS command can be input if both banks are in an inactivation state. When tRSC is elapsed after the MRS command is input, the SDRAM can operate with respect to new commands. When the MRS command is input, the control registers are reset. The operation of switching between disable/enable state in accessing the control registers while holding the content of the control register can be performed by controlling signal CRYP with bit A10 of 0 at the time of the mode register set of the SDRAM.

Figure 32:
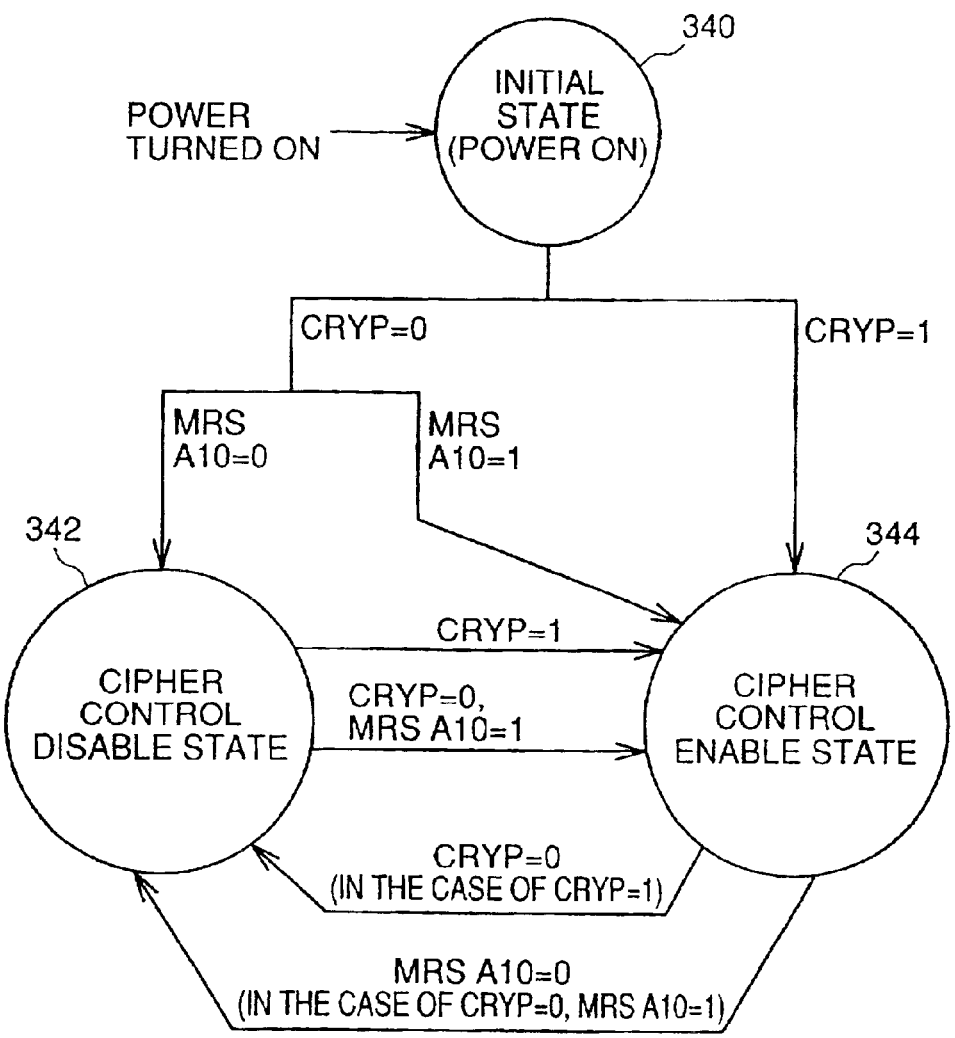
FIG. 32 is a diagram showing a state transition associated with cipher control entry/exit of the ScRAM.

FIG. 32 is a diagram showing a state transition associated with cipher control entry/exit of the ScRAM.

When the power is turned on, the state of the ScRAM is changed to an initial state 340. Successively, when signal CRYP is set to 1, the state is changed to a state 344 which enables cipher control. If signal CRYP is 0, by setting bit A10 to 1 by a mode register set command, the state can be changed to a cipher control enable state 344.

By setting signal CRYP to 0 in initial state 340 of power on and setting 0 to bit A11 a mode register command, the state is changed to a cipher control disable state 342.

The transition from state 342 to 344 may be made by setting 1 to signal CRYP1 or by setting 1 to bit A10 by the mode register set command with signal CRYP being 0.

Now, the transition from cipher control enable state 344 to cipher control disable state 342 will be described. The transition can be made by setting 0 to signal CRYP if cipher control enable state 344 is entered by setting 1 to signal CRYP. If enable state 344 is entered by setting 0 to signal CRYP and setting 1 to bit A10 by the mode register set command, the transition to disable state 342 is made by setting 0 to bit A10 by the mode register set command.

Figure 33:
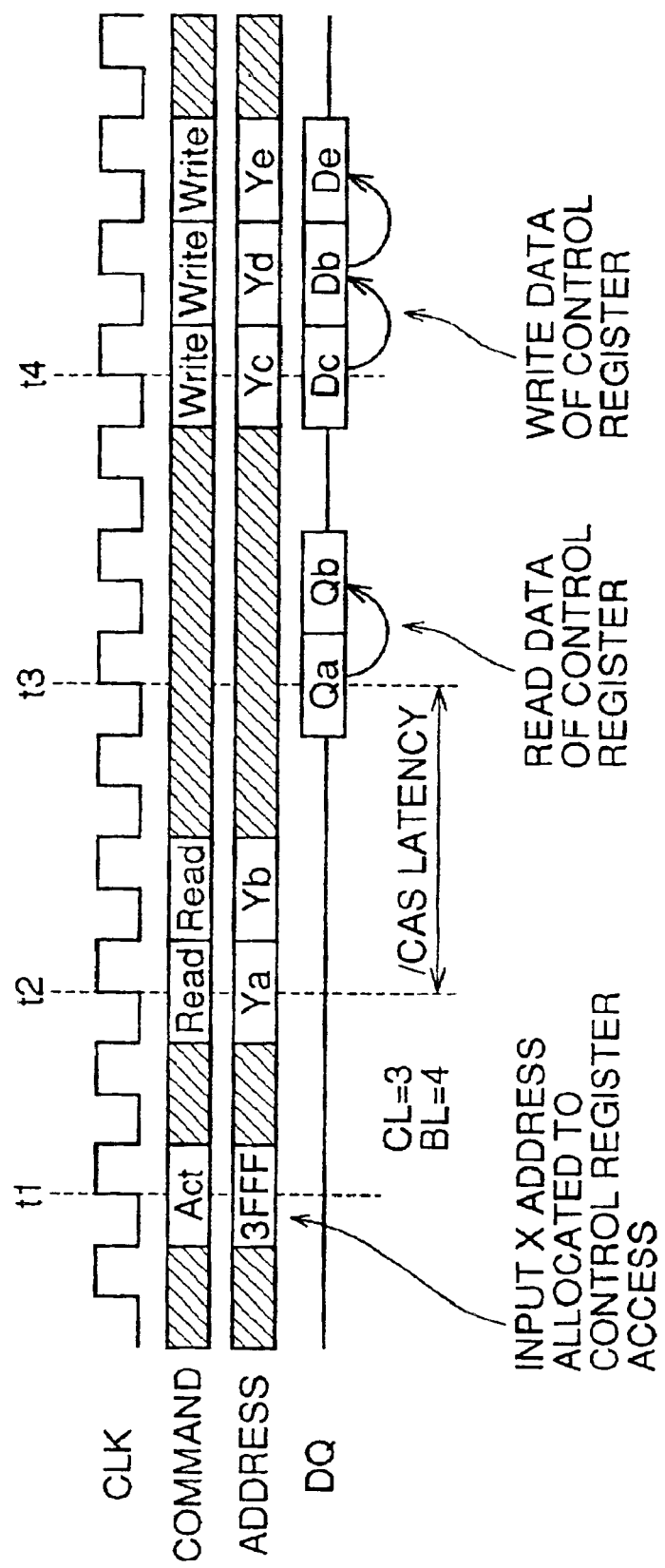
FIG. 33 is a diagram showing exemplary operation waveforms for access by the control register.

FIG. 33 is a diagram showing exemplary operation waveforms in accessing the control registers.

Referring to FIG. 33, it is assumed that a page of X=#3FFF is allocated to the control register access region. Since the SDRAM is set in a mode where CAS latency CL equals to 3, the output from the register has a timing of CL=3.

Here, regardless of a burst length BL which has been set by the mode register set, the burst length is fixed to 1 for register access. Thus, a read/write command and column address must be input in every cycle.

FIGS. 34 to 37 are diagrams shown in conjunction with an address map of the control register.

FIG. 34 relates to the case where the column address is h00, h01, FIG. 35 to h02, FIG. 36 to h03, h04, h05, h06, and FIG. 37 to h13 to h20.

These X addresses are initially set to h3FFF or h0.

Next, features of the cipher function of the ScRAM will be described.

The ScRAM is internally provided with an accelerator of a major encryption method used for ensuring security over the network. The ScRAM also supports the functions of a public key cryptosystem used for electronic authorization and a secret key cryptosystem used for transmission/ reception of data after authorization. These functions are performed by a dedicated cipher logic 228 shown in FIG. 27, so that they are well suited to a system which requires rapid encryption process with low power consumption.

The encryption method which is supported is similar to that of FIG. 9. RAS as well as DES and triple DES are supported respectively as public key cryptosystem and secret key cryptosystem. Further, the secret key cryptosystem supports ECB, CBC, OFB, CFB-64 which are major block cipher modes.

These cryptosystems are used as major cryptosystems not only over a general network but also over the Internet. The ScRAM can be used for major blousers like Netscape Communicator or Internet Explorer, and S/MIME of an encryption e-mail method. For an electronic commerce market with projected expansion, security with these cryptosystems would become more important. The above mentioned cryptosystem is supported in wireless application protocol (WAP) which would potentially be applied to portable telephones in the future, and thus the ScRAM has sufficient adaptability to various systems.

The ScRAM only performs critical processes for encryption by an internal cipher logic to enhance adaptability to applications. Namely, the processes such as hash, data encoding and padding are performed by a software as in the conventional case. Thus, the application can enjoy a higher degree of freedom. For RSA, the following operations a) and b), which will take most of the processing time required for a software process, are only performed.

a) For rapid electronic authorization by RSA, the following operations are performed.

Power residue operation $M^e$ mod N

Montgomery multiplication residue operation $X * Y * R^{-1}$ mode N

Residue operation Y mod N b) For rapid encryption communication, operations of triple DES, DES (CBC, ECB, OFB, CFB-64) are performed. Note that the padding process on the final text block portion varies according to standards, it must be performed by a software.

Then, encryption process speed will be described.

One-chip integration of a logic dedicated to an address process and the DRAM enables rapid process and reduction in power consumption. Thus, an RSA cipher signature processing time with 1024 bits at a low power supply voltage (2.5V system) suitable for portable devices would be about 100 ms to 200 ms. Namely, triple DES and DES can respectively provides about 60 Mbps and about 180 Mbps.

The ScRAM controls a cipher logic portion by accessing a specific address space, providing pin compatibility with respect to a general purpose SDRAM. In addition, if the cipher function is disabled, only the function as the SDRAM can be used.

Now, a cipher function controlling method will be described.

As stated previously, the cipher function of the ScRAM can be controlled by accessing the control registers. The control registers can be accessed by inputting a prescribed address at the time of mode register set or by setting 1 to the terminal supplied with signal CRYP and accessing a prescribed address. Here, the address space of default allocated to the control register corresponds to a page of X=h3FFF. If 1 is set to both bits A10 and A11 at the input of the MRS command, the control registers can be allocated to a page of X=h0.

However in a firmware design, it is required that the space reserved for access to the control registers should not be used for other purposes. For example, allocation of this space to the application or kernel is inhibited. For the kernel, care must be paid not to be allocated at the time of boot.

Now, an example of the system design will be described.

Figure 38:
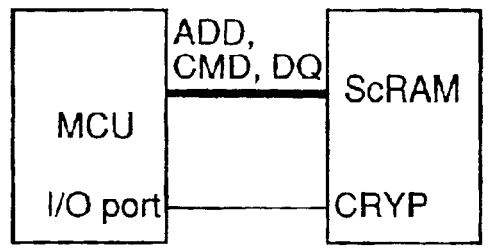
FIG. 38 is a diagram shown in conjunction with a system capable of controlling a terminal for applying a signal CRYP.

FIG. 38 is a diagram shown in conjunction with a system which can control a terminal supplied with signal CRYP.

Referring to FIG. 38, a system is shown which can connect an I/O port of a general microcomputer (MCU) to a terminal supplied with signal CRYP. In this structure, if the CRYP terminal can be set to 0 before boosting of the system, the address space has not yet been allocated to the control register, so that the space used for initially loading the program is not restricted if the region loaded with the program includes X=h3FFF, the CRYP terminal is subsequently set to 1 and the address space allocated to the control register must be changed to the page of X=h0.

Figure 39:
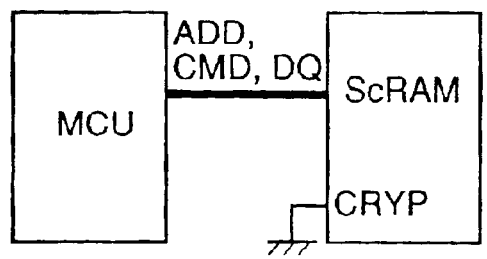
FIGS. 39 and 40 are first and second diagrams shown in conjunction with a system unable to control a CRYP terminal.
Figure 40:
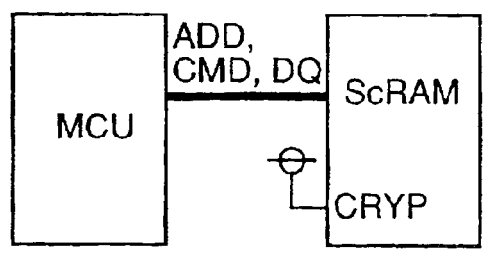

FIGS. 39 and 40 are diagrams shown in conjunction with a system which cannot control the CRYP terminal.

Referring to FIG. 39, when value applied to the CRYP terminal is fixed to 0, access to the control register is enabled by setting bit A0 to A1 at the input of the mode register set (MRS) of the ScRAM. At the time, the space not loaded with the program is selected by bit A11.

Referring to FIG. 40, if the value supplied to the CRYP terminal is fixed to 1, the access space to the control register is allocated to a page of X=h3FFF, so that the program must not be loaded while avoiding this space.

Figure 41:
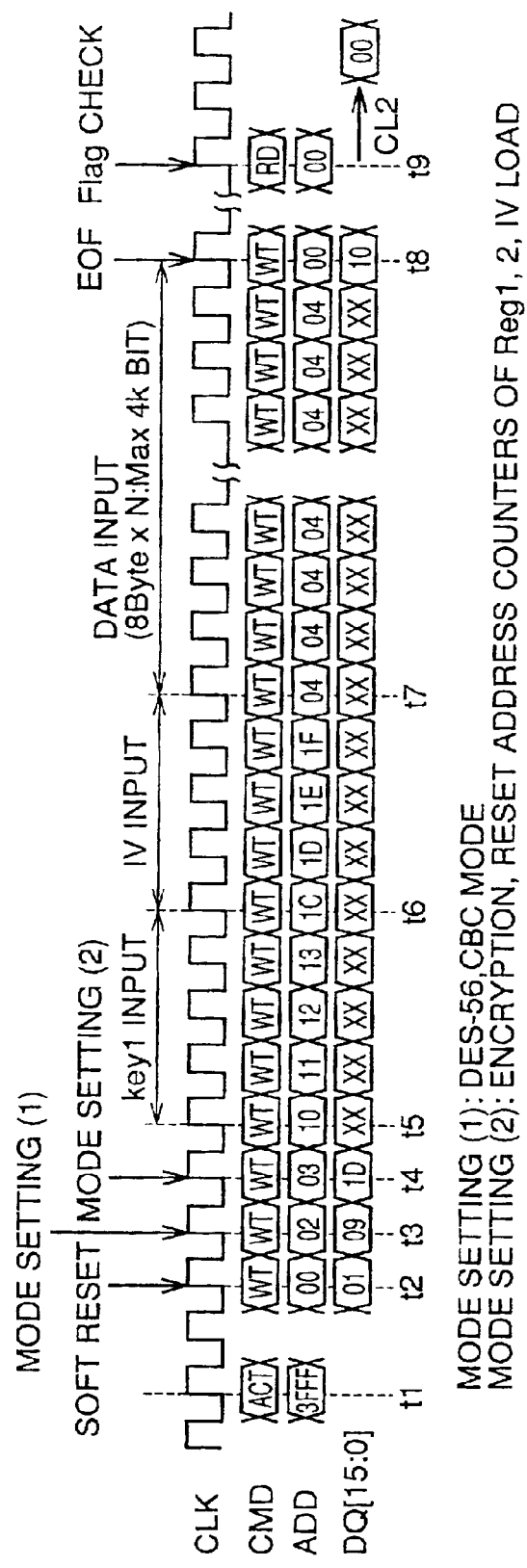
FIG. 41 is a diagram showing operation waveforms used for explaining setting to the control register.

FIG. 41 is a diagram showing operation waveforms used for explaining settings of the control registers.

Referring to FIG. 41, exemplary signal inputs for setting of the control registers are shown. The only difference from the DRAM in accessing the control registers in that the burst length is 1 regardless of the setting of the MRS. Otherwise, the control registers are accessed at the same timing and in the same sequence as the DRAM.

In FIG. 41, by way of example, the address space for accessing the control register is X=3FFF.

First, at a time t1, address X=h3FFF for accessing the control register is input.

Then, at a time t2, a software is reset.

At a time t3, a mode setting (1) is performed. In mode setting (1), DES-56 is selected as a secret key cryptosystem and a process is performed in CBC mode.

Then, at a time t4, a mode setting (2) is performed. In mode setting (2), it is set that encryption is performed, address counters of REG and REG2 are reset and IV is used as an initial value.

Between times t5 and t6, a secret key is input.

Between times t6 and t7, an initial vector IV is input.

Between times t7 and t8, a plain text of 8 bytes is input and, at t8 after input of the plain text, EOF (End of File) is input.

At a time t9, reading with respect to a flag region is performed to check if a cipher logic is in process or not.

The check result is read as data signal DQ with CAS latency.

Next, a secret key cryptosystem supported by the ScRAM will be described.

Figure 42:
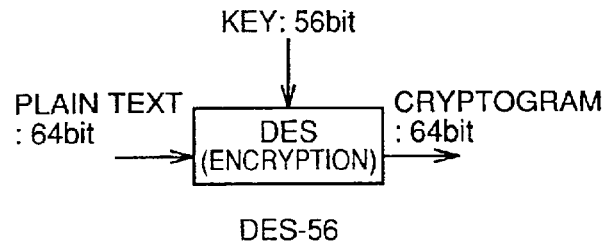
FIGS. 42 to 44 are first to third schematic diagrams shown in conjunction with a basic unit in an encryption process.
Figure 43:
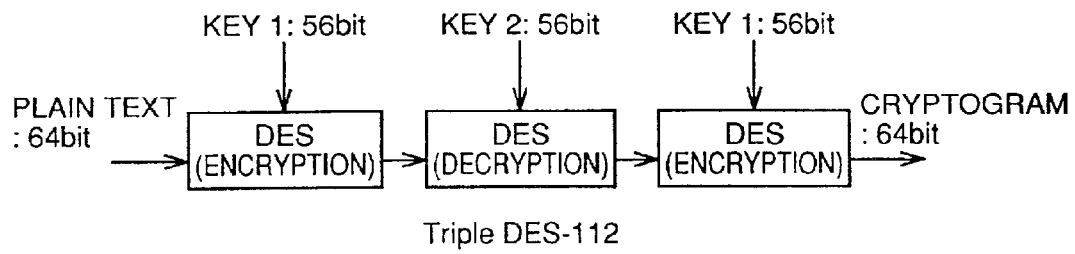
Figure 44:
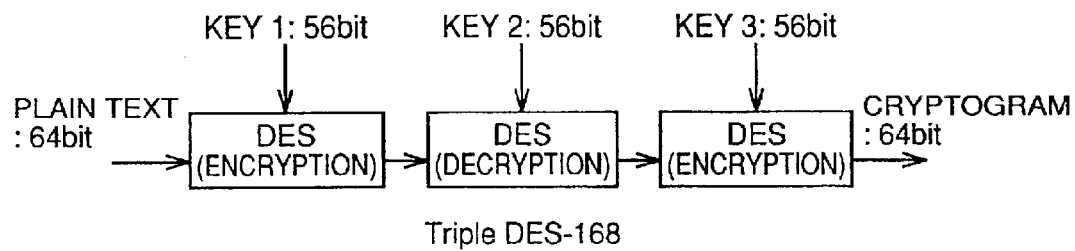

FIGS. 42 to 44 are schematic diagrams shown in conjunction with a basic unit for an encryption process.

FIG. 42 relates to DES with a key length of 56 bits, FIG. 43 relates to a triple DES method with a key length of 112 bits, and FIG. 44 relates to a triple DES method with a key length of 168 bits. In the ScRAM, DES and triple DES are supported as the secret key cryptosystem. These cryptosystems are utilized by a security socket layer on the Internet, e-mail of S/MIME, and a wireless application protocol. Note that, in triple DES, DES is subjected to three processes of encryption, decryption and encryption.

Figure 45:
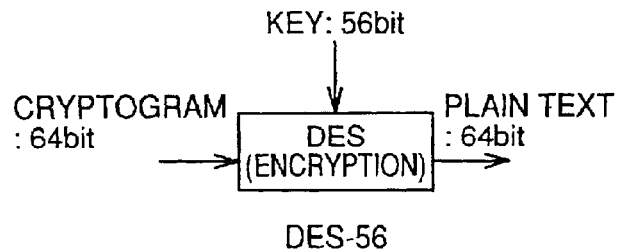
FIGS. 45 to 47 are first to third schematic diagrams showing a unit in a decryption process.
Figure 46:
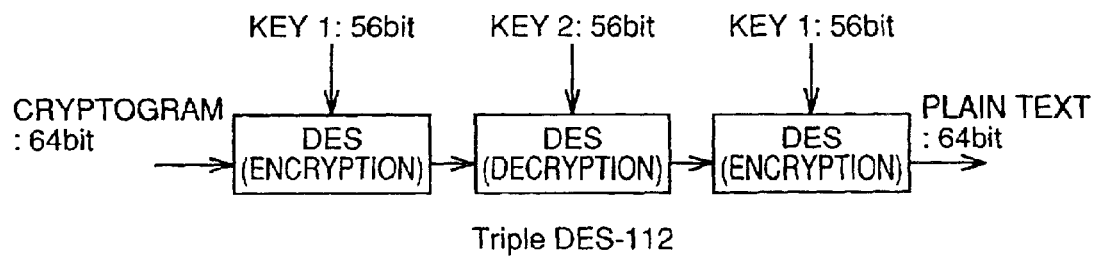
Figure 47:
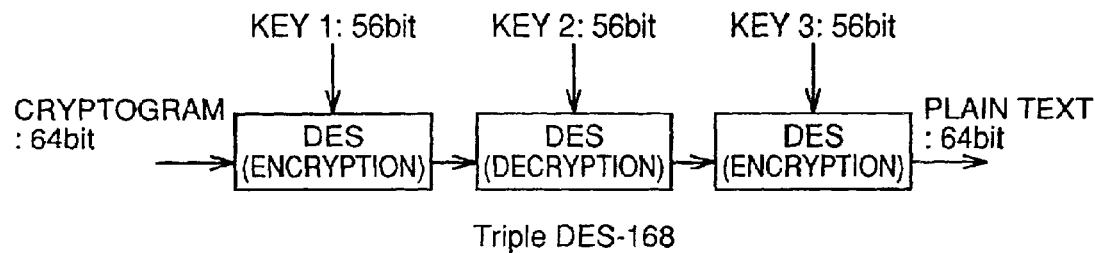

FIGS. 45 to 47 are schematic diagrams shown in conjunction with a unit for a decryption process.

FIG. 45 relates to decryption corresponding to the encryption of FIG. 42, FIG. 46 relates to decryption corresponding to the encryption of FIG. 43, and FIG. 47 relates to decryption corresponding to the encryption of FIG. 44.

Next, a cipher utilization mode of a secret key cipher supported by the ScRAM will be described. Two modes of ECB and CBC are described by way of example.

FIGS. 48 and 49 are diagrams shown in conjunction with an ECB mode.

Referring to FIGS. 48 and 49, the ECB mode is a basic mode, corresponding to a basic unit for an encryption/decryption process. For encryption, an encryption process is performed on each of blocks Mi (M=M1, M2, M3 . . . ) obtained by dividing general data (plain text) M by every 64 bits as shown in FIG. 48, using data K which is called a secret key and shared by a transmitter and a receiver. Thus, cryptograms Ci (C=Cl, C2, C3 . . . ) each having 64 bits are generated. For decryption, as shown in FIG. 49, cryptogram Ci of 65 bits is received and, using the same key data K as that for encryption, plain text Mi (M=Mi, M2, M3 . . . ) is generated.

Now, the CBC mode will be described.

FIG. 50 is a diagram shown in conjunction with an operation in the CBC mode.

Referring to FIG. 50, in the CBC mode, encryption is performed on blocks Mi each obtained by dividing plain text M by every 64 bits as in the case of the ECB mode. Then, an exclusive OR of cryptogram block Ci and the next block Mi+1 is used as an input for the next encryption. This is repeated to form a chain.

On the other hand, for decryption, a result Mi is obtained by performing decryption on cipher block text Ci as in the case of the ECB mode. An exclusive OR of Ci and the decryption result of cryptogram block Ci+1 is taken to generate output plain text block Mi+1. This is repeated to form a chain. It is noted that, in FIG. 50, the plain text, cryptogram, encryption using cipher key K, and decryption are respectively represented by Mi, Ci (i =1, 2, . . . ), Ek, and Dk.

IV (initial vector) represents an initial value used for initial encryption and decryption. IVs match on the sides of encryption and decryption. Since the value of IV may be known to the third party, secret transmission of IV between the transmitter and receiver is not necessary. The change in the value of IV results in a different cryptogram from the same message.

Figure 51:
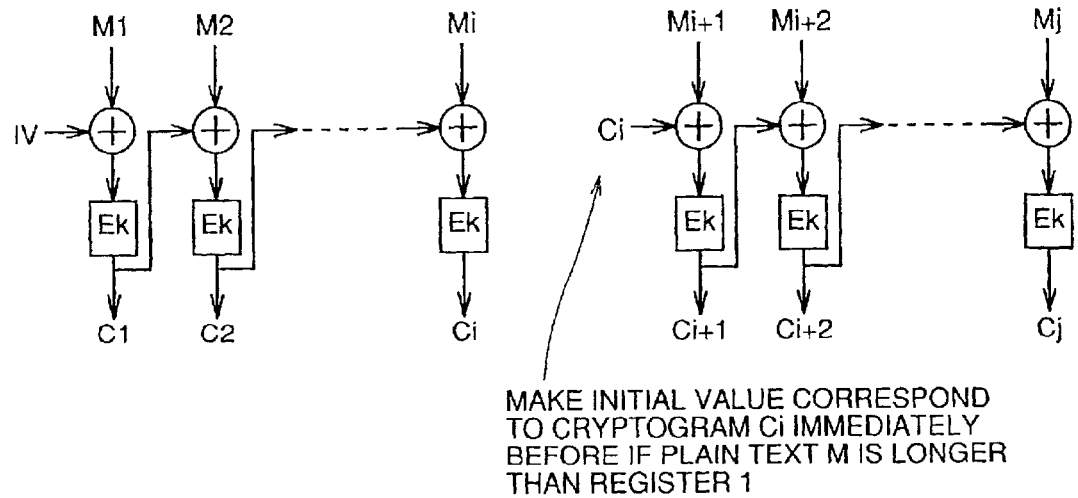
FIGS. 51 and 52 are diagrams respectively shown in conjunction with encryption and decryption in the CBC mode.
Figure 52:
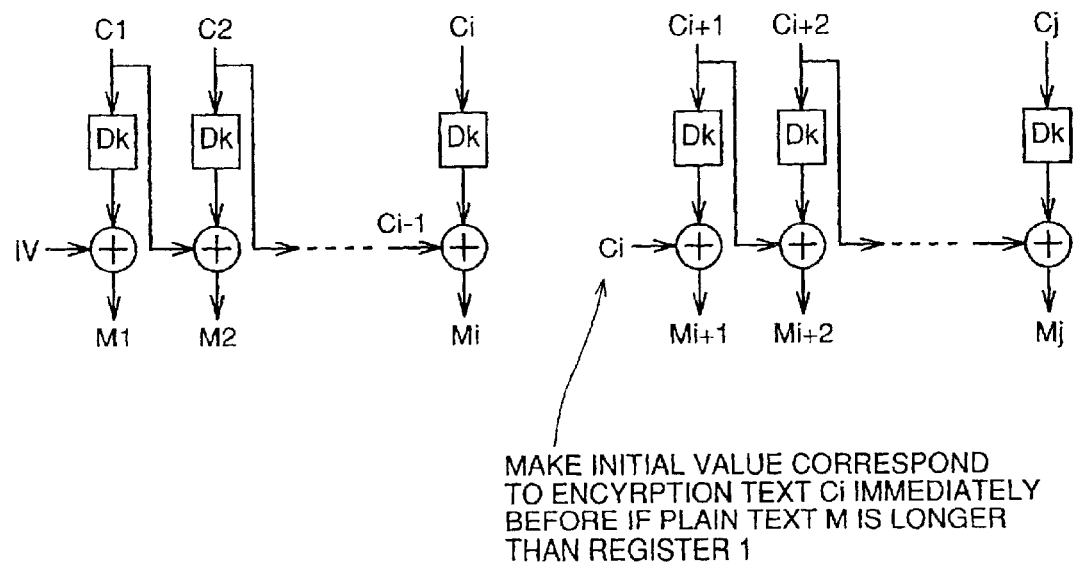
Figures 54, 55:
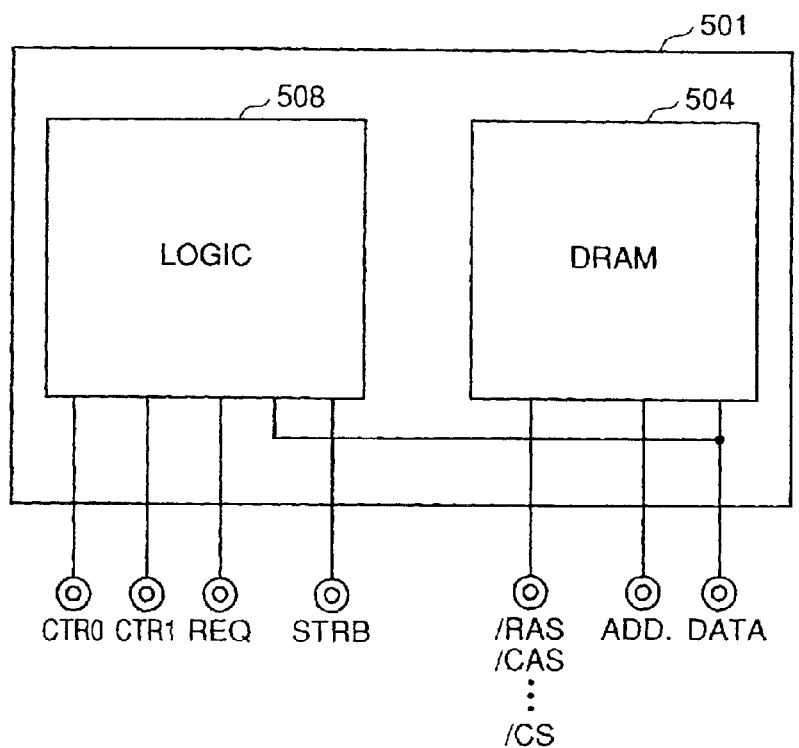
FIG. 54 is a table showing terminal names and functions of the SDRAM.
FIG. 55 is a diagram showing a configuration of a conventional DRAM with a logic.

FIGS. 51 and 52 are schematic diagrams shown in conjunction with encryption and decryption in the CBC mode.

Referring to FIGS. 51 and 52, the length of plain text that can be input to the ScRAM at a time is 4k bit, which is a size of register REG1. Thus, in processing a plain text having longer length than 4k bits, the control register is set such that cryptogram block Ci immediately before has an initial value.

In the embodiments of the present invention, the SDRAM is applied to the present invention, by way of example. However, the present invention is not limited to application to the SDRAM, and may be applied to an asynchronous DRAM, e.g., EDO (Extended Data Out) DRAM. Further, the present invention can be applied to other synchronous DRAMs, including a DRAM having a DDR (Double Data Rate) interface or the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
a terminal group receiving an externally applied control signal, address, and data;
a memory cell array including a plurality of memory cells arranged in rows and columns;
a logic circuit processing data in accordance with at least one of said control signal, said address, and said data when said address applied to said terminal group designates a prescribed first region of said memory cell array;
a memory circuit transmitting/receiving said data to/from a memory cell corresponding to said address in said memory cells array in accordance with said control signal and said address when said address applied to said terminal group designates a region except said prescribed first region.

2. The semiconductor memory device according to claim 1, further comprising an interface portion receiving said control signal, said address, and said data from said terminal group for instructing an operation in accordance with at least one of said control signal, said address, and said data with respect to at least one of said memory cell array and said logic circuit in accordance with said address, said logic circuit including
a data holding portion for holding a content of the instruction from said interface portion, and
a data processing circuit for processing data according to the content held in said data holding portion.

3. The semiconductor memory device according to claim 2, wherein said instruction content includes a command for designating an operation of said data processing circuit, and input data processed by said data processing circuit, and
said holding portion includes
a first holding circuit holding said command,
a second holding circuit holding said input data, and
a third holding circuit holding a result of said data processing circuit resulting from said input data.

4. The semiconductor memory device according to claim 3, wherein said data holding portion further includes a fourth holding circuit holding a flag indicating as to if the data process has been completed by said data processing circuit.

5. The semiconductor memory device according to claim 3, wherein said data processing circuit performs an encryption process, and said input data includes key data of a cipher.

6. The semiconductor memory device according to claim 2, wherein said instruction content includes designation of a plurality of operation modes of said data processing circuit, and
said data holding portion has a holding circuit holding said plurality of operations modes, said holding circuit has a capacity of bits corresponding to data written to said memory array at a time, and
the designation of said plurality of operation modes with respect to said logic circuit is performed in a sequence of one operation of writing data to said memory cell array.

7. The semiconductor memory device according to claim 2, wherein said interface portion includes a mode register which can be rewritten in accordance with said control signal, and
said interface portion determines a portion of an address space to which said first region is allocated in accordance with a value held in said mode register.

8. The semiconductor memory device according to claim 1, wherein said prescribed first region is a portion of a real address space of said memory cell array.

9. The semiconductor memory device according to claim 1, wherein said prescribed first region is a portion of a virtual address space other than a real address space of said memory cell array.

10. The semiconductor memory device according to claim 9, wherein said logic circuit processes data stored in said address space of said memory cell array corresponding to said prescribed first region in accordance with access to said prescribed first region which is a portion of said virtual address space.

11. A semiconductor memory device, comprising:
a first terminal group receiving an externally applied control signal, address, and data;
a memory including a plurality of memory cells arranged in rows and columns and activated in accordance with an externally applied select signal for transmitting/receiving said data in accordance with said control signal with respect to a memory cell in a region designated by said address;
a logic circuit activated in accordance with said select signal in a complementary manner with respect to said memory for processing data in accordance with at least one of said address and said data; and
a second terminal receiving said select signal.

12. The semiconductor memory device according to claim 11, wherein said memory performs an operation of selecting said memory cell in accordance with said address including a row address and a column address time divisionally applied to said first terminal group, and said logic circuit performs an operation in accordance with said address is collectively applied to said first terminal group.

13. The semiconductor memory device according to claim 12, wherein said logic circuit includes an ATD circuit detecting changes in said row address and said column address for generating an operation timing.

* * * * *